(12) United States Patent
Kim

(10) Patent No.: US 11,995,918 B2
(45) Date of Patent: May 28, 2024

(54) FINGERPRINT AUTHENTICATION DEVICE, DISPLAY DEVICE INCLUDING THE SAME, AND METHOD OF AUTHENTICATING FINGERPRINT

(71) Applicant: SAMSUNG DISPLAY CO., LTD., Yongin-si (KR)

(72) Inventor: Kee Yong Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/451,736

(22) Filed: Oct. 21, 2021

(65) Prior Publication Data

US 2022/0261586 A1 Aug. 18, 2022

(30) Foreign Application Priority Data

Feb. 9, 2021 (KR) .................. 10-2021-0018613

(51) Int. Cl.
| | |
|---|---|
| *G06K 9/00* | (2022.01) |
| *G02B 5/20* | (2006.01) |
| *G06V 40/12* | (2022.01) |
| *G06V 40/13* | (2022.01) |
| *G06V 40/40* | (2022.01) |
| *H01L 27/146* | (2006.01) |

(52) U.S. Cl.
CPC ............. *G06V 40/40* (2022.01); *G02B 5/20* (2013.01); *G06V 40/1318* (2022.01); *G06V 40/1365* (2022.01); *H01L 27/1462* (2013.01); *H01L 27/14678* (2013.01)

(58) Field of Classification Search
CPC ............. G06V 40/40; G06V 40/1318; G06V 40/1365; H01L 27/1462; H01L 27/14678; G02B 5/20
See application file for complete search history.

(56) References Cited

U.S. PATENT DOCUMENTS

2019/0019000 A1* 1/2019 Lee ........................ G02B 5/20
2022/0027598 A1 1/2022 Lee et al.

FOREIGN PATENT DOCUMENTS

KR 10-2014394 8/2019
KR 10-2022-0014441 2/2022

* cited by examiner

*Primary Examiner* — Abdul-Samad A Adediran
(74) *Attorney, Agent, or Firm* — F. Chau & Associates, LLC

(57) ABSTRACT

A display device includes a sensor on a display panel, an optical filter, and a fingerprint detector. The sensor includes a first area and a second area and is configured to sense light transmitted through the display panel. The optical filter is between the display panel and sensor, and overlaps with the first area but not the second area. The optical filter blocks light corresponding to a first wavelength range in a wavelength range of the light. The fingerprint detector determine whether a fingerprint is a fake fingerprint or a pre-registered fingerprint based on a first sensing signal and a second sensing signal. The first sensing signal correspond to an area in contact with a finger in the second area, and the second sensing signal corresponds to an area not in contact with the finger among sensing signals from the sensor.

20 Claims, 28 Drawing Sheets

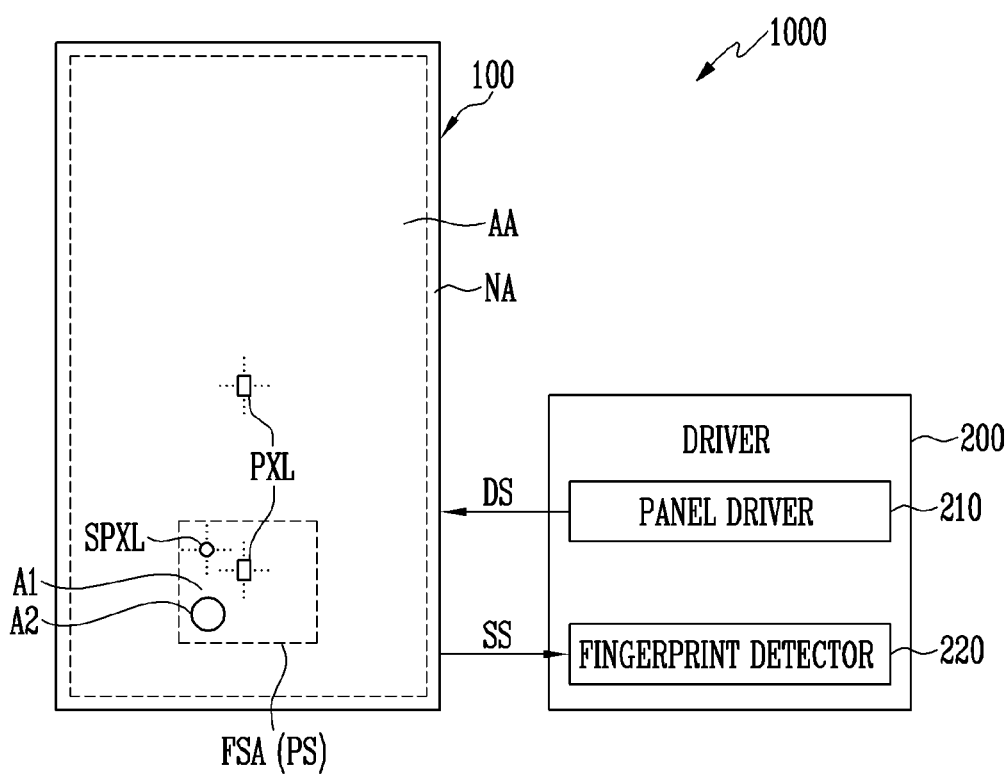

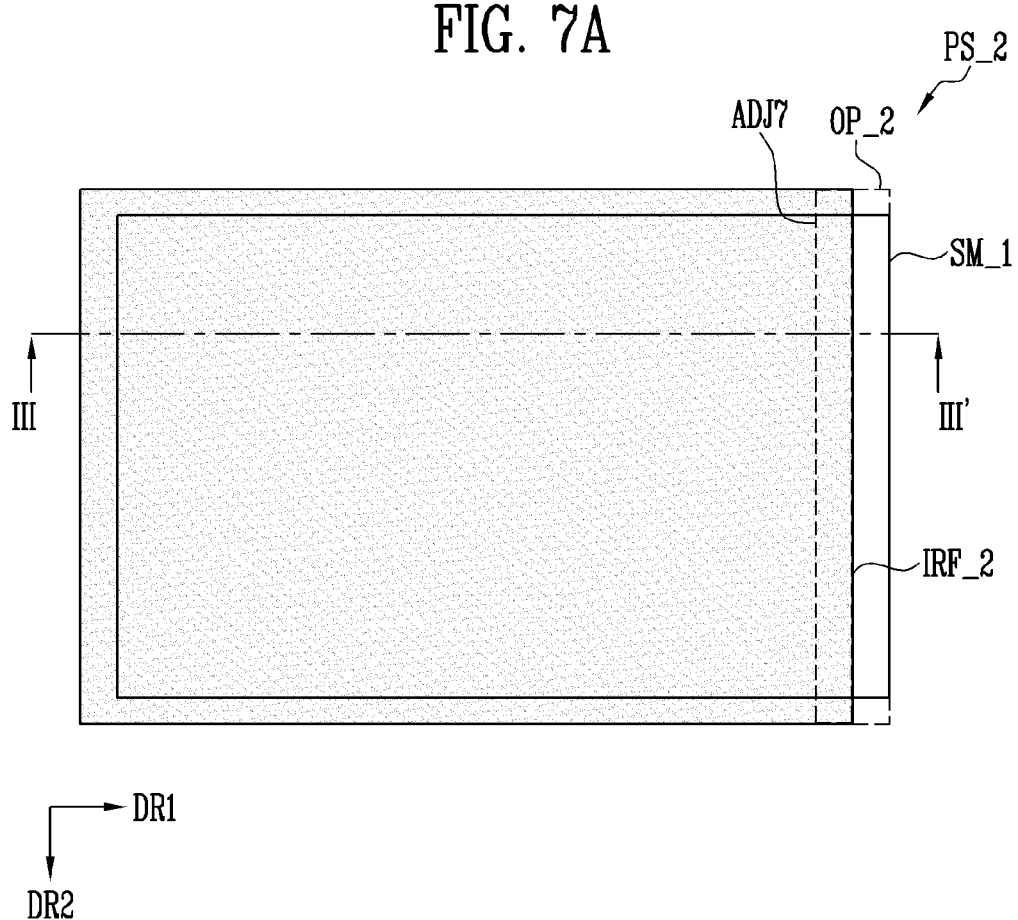

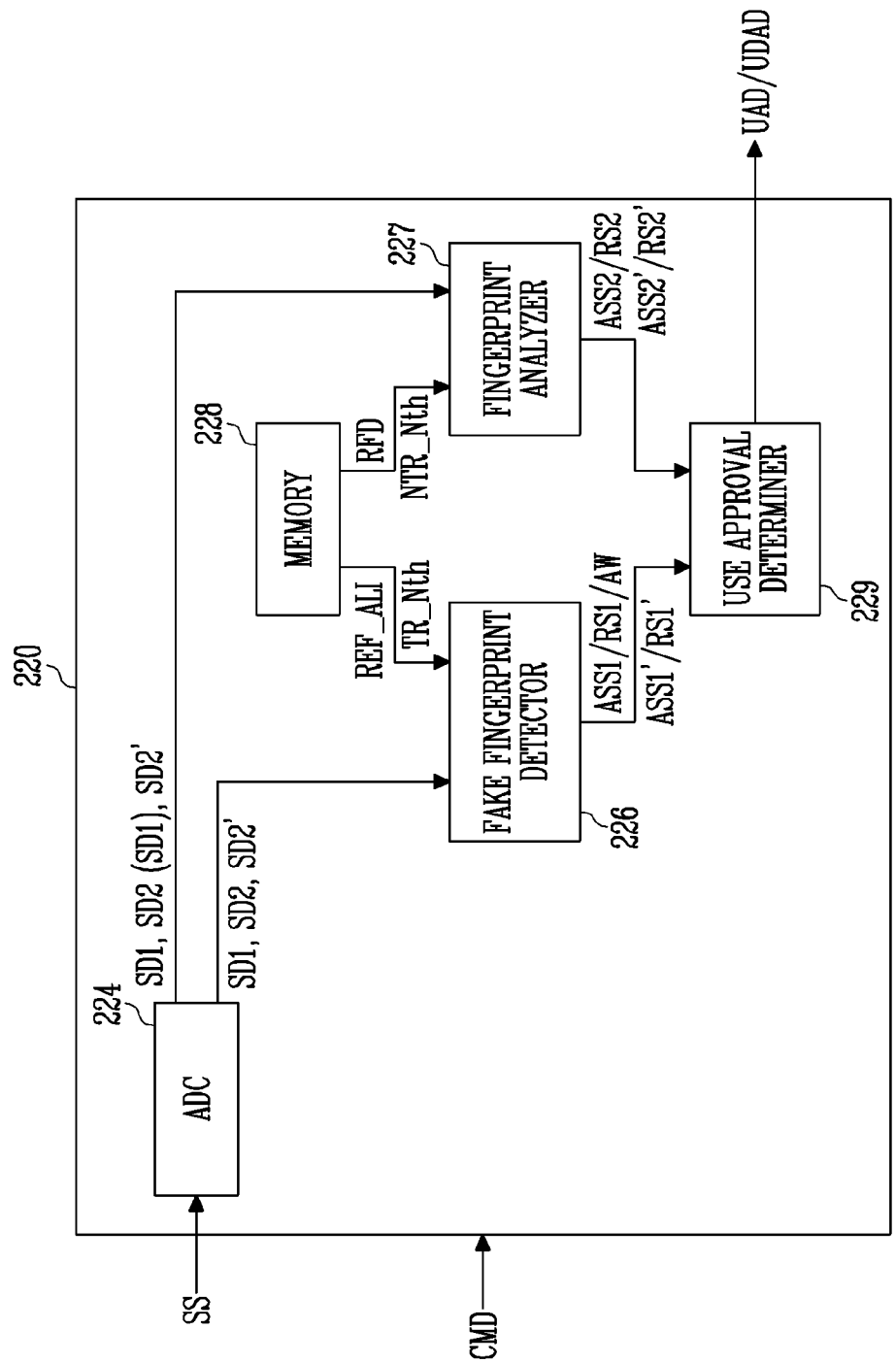

LUT

FIG. 9

| Color | R | G | B | R의 비율<br>(R / (G+B)) |
|---|---|---|---|---|
| Dark Skin | 115 | 82 | 68 | 0.766667 |
| Light Skin | 194 | 150 | 130 | 0.692857 |
| Blue Sky | 98 | 122 | 157 | 0.35125 |
| Foliage | 87 | 108 | 67 | 0.497143 |
| Blue Flower | 133 | 128 | 177 | 0.436066 |
| Bluish Green | 103 | 189 | 170 | 0.28691 |
| Orange | 214 | 126 | 44 | 1.258824 |
| Purple Red | 80 | 91 | 166 | 0.31128 |
| Moderate Red | 193 | 90 | 99 | 1.021164 |
| Purple | 94 | 60 | 108 | 0.559524 |
| Yellow Green | 157 | 188 | 64 | 0.623016 |
| Orange Yellow | 224 | 163 | 46 | 1.07177 |
| Blue | 56 | 61 | 150 | 0.2654 |
| Green | 70 | 148 | 73 | 0.31674 |
| Red | 175 | 54 | 60 | 1.535088 |
| Yellow | 231 | 199 | 31 | 1.004348 |
| Magenta | 187 | 86 | 149 | 0.795745 |
| Cyan | 8 | 133 | 161 | 0.02721 |
| White | 243 | 243 | 242 | 0.50103 |
| Neutral 8 | 200 | 200 | 200 | 0.5 |
| Neutral 65 | 160 | 160 | 160 | 0.5 |
| Neutral 5 | 122 | 122 | 121 | 0.502058 |
| Neutral 35 | 85 | 85 | 85 | 0.5 |
| Black | 52 | 52 | 52 | 0.5 |

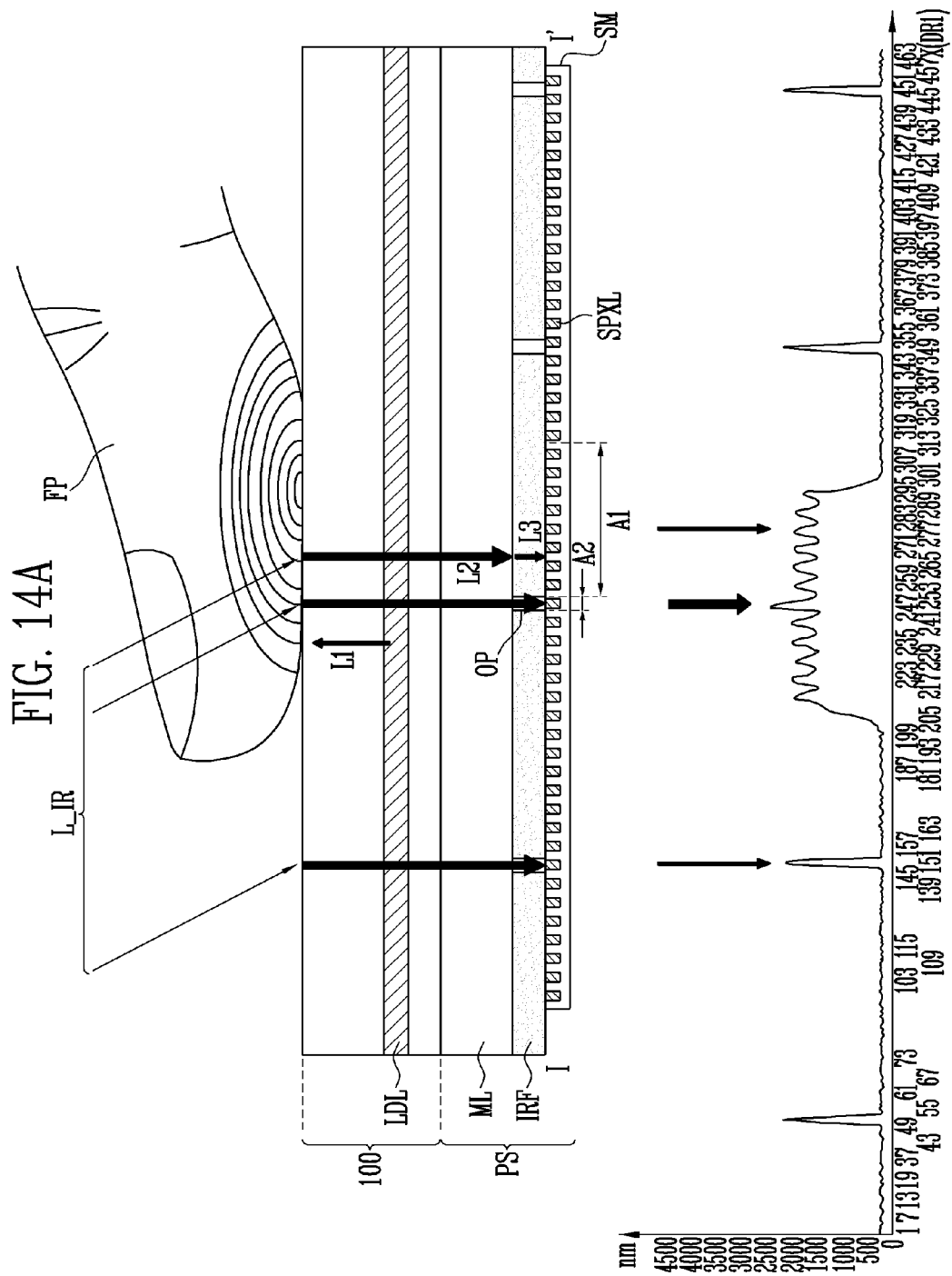

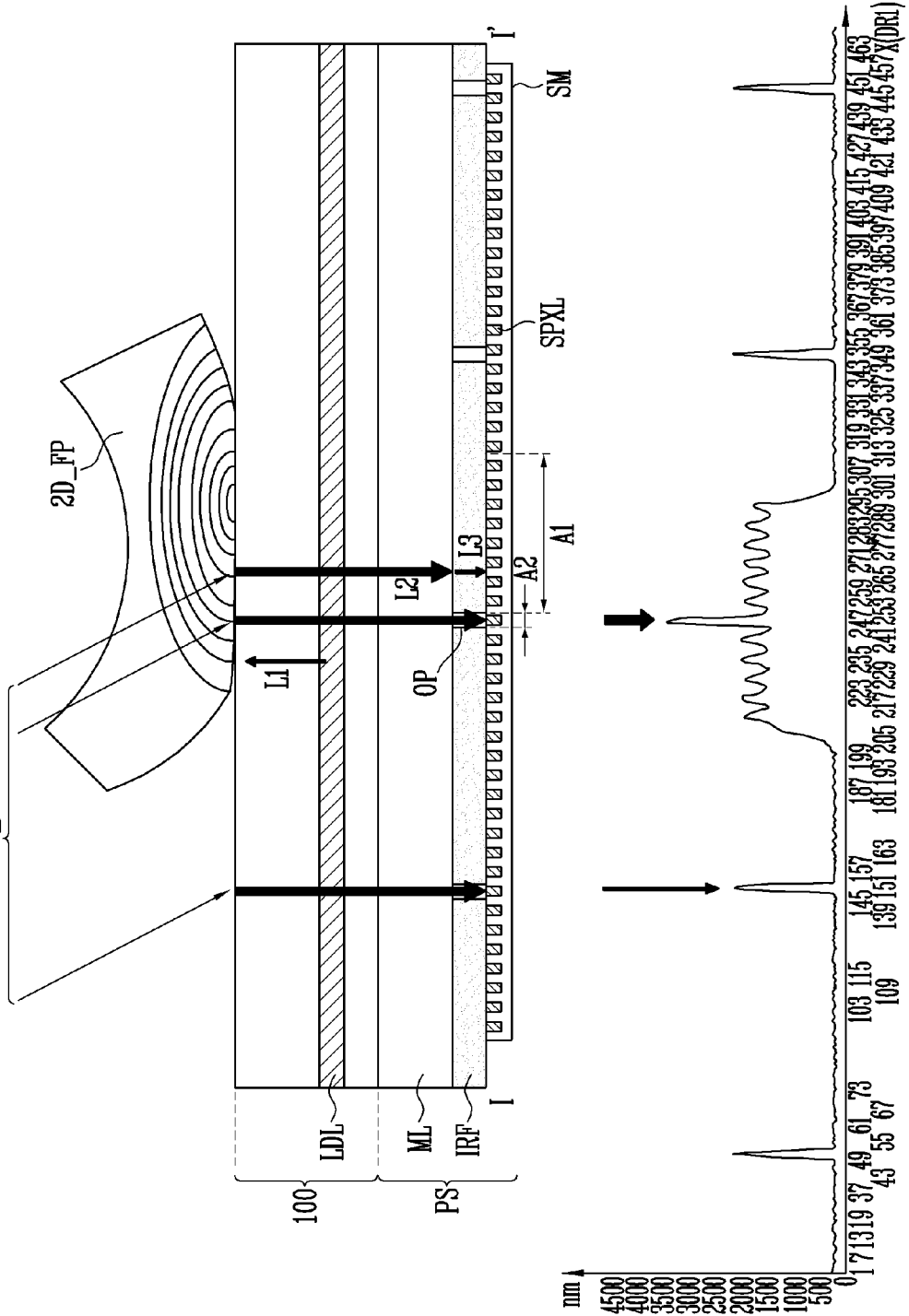

FINGERPRINT AUTHENTICATION DEVICE, DISPLAY DEVICE INCLUDING THE SAME, AND METHOD OF AUTHENTICATING FINGERPRINT

CROSS-REFERENCE TO RELATED APPLICATION

The present application claims priority under 35 U.S.C. § 119(a) to Korean patent application 10-2021-0018613, filed on Feb. 9, 2021, in the Korean Intellectual Property Office, the entire disclosure of which is incorporated by reference herein.

BACKGROUND

1. Field of the Disclosure

One or more embodiments described herein relates to a fingerprint authentication device, a display device including a fingerprint authentication device, and a method of authenticating a fingerprint.

2. Background of the Related Art

Smartphones, tablet computers, and other devices with displays have been designed to perform user authentication based on a fingerprint. To perform fingerprint sensing, a fingerprint sensor may be built into or attached to the display. One type of display device integrated with a fingerprint sensor may be referred to as a Fingerprint on Display (FoD). An FoD may be configured, for example, as a photosensitive-type sensor that uses a light emitting element in a pixel as a light source. An FoD may also include a photo sensor array implemented, for example, as a CMOS Image Sensor (CIS).

Authentication performed using a fingerprint sensor is mainly used in fields that require security, e.g., e-commerce applications, financial transactions, electronic device security, and approval-of-use. It is a goal of system designers not only to improve the accuracy of fingerprint recognition, but also to effectively identify a forged fingerprint (e.g., a fake fingerprint).

SUMMARY

One or more embodiments described herein provide a fingerprint authentication device, a display device including the same, and a method of authenticating a fingerprint, which can detect a fake fingerprint.

In accordance with one or more embodiments, a display device includes a display panel; a sensor disposed on the display panel and including a first area and a second area, the sensor configured to sense light transmitted through the display panel; a first optical disposed between the display panel and the sensor, the optical filter overlapping with the first area and not overlapping with the second area, the optical filter configured to block light corresponding to a first wavelength range in a wavelength range of the light; and a fingerprint detector configured to determine whether a fingerprint is a fake fingerprint or a pre-registered fingerprint based on a first sensing signal corresponding to an area in contact with a finger in the second area and a second sensing signal corresponding to an area not in contact with the finger among sensing signals from the sensor.

In accordance with one or more embodiments, a method drives a display device which includes a display panel, a sensor, a optical filter, and a fingerprint detector. The method includes sensing, by the sensor, light transmitted through the display panel, wherein the sensor is disposed on the display panel and includes a first area and a second area; blocking, by the optical filter, light corresponding to a first wavelength range, wherein the optical filter is disposed between the display panel and the sensor, overlaps with the first area and does not overlap with the second area; and determining, by the fingerprint detector, whether a fingerprint is a fake fingerprint or a pre-registered fingerprint based on a first sensing signal corresponding to an area in contact with a finger in the second area and a second sensing signal corresponding to an area not in contact with the finger among sensing signals from the sensor.

In accordance with one or more embodiments, a display device includes a display panel; a sensor disposed on the display panel and including a first area and a second area, the sensor configured to sense light transmitted through the display panel; and a optical filter disposed between the display panel and the sensor, the optical filter overlapping with the first area and not overlapping with the second area, the optical filter configured to block the light of a first wavelength range. The first area at least partially surrounds the second area and the optical filter includes at least one opening corresponding to the second area, and the openings are disposed to be spaced apart from each other at a first separation distance on a plane, such that at least one of the openings corresponds to a detected fingerprint.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete as understood by those skilled in the art.

Also, in the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 1A and 1B illustrate embodiments of a display device.

FIGS. 8A and 8B illustrate an embodiment of a fingerprint detector.

FIG. 9 illustrates an example of a lookup table including values in a reference range for the fingerprint detector of FIGS. 8A and 8B.

FIG. 14A illustrates an example of a transmission rate of light when the finger of a user contacts a second area, FIG. 14B illustrates an example of a transmission rate of light when a two-dimensional imitation fingerprint contacts a second area.

DETAILED DESCRIPTION

Figure 1B:
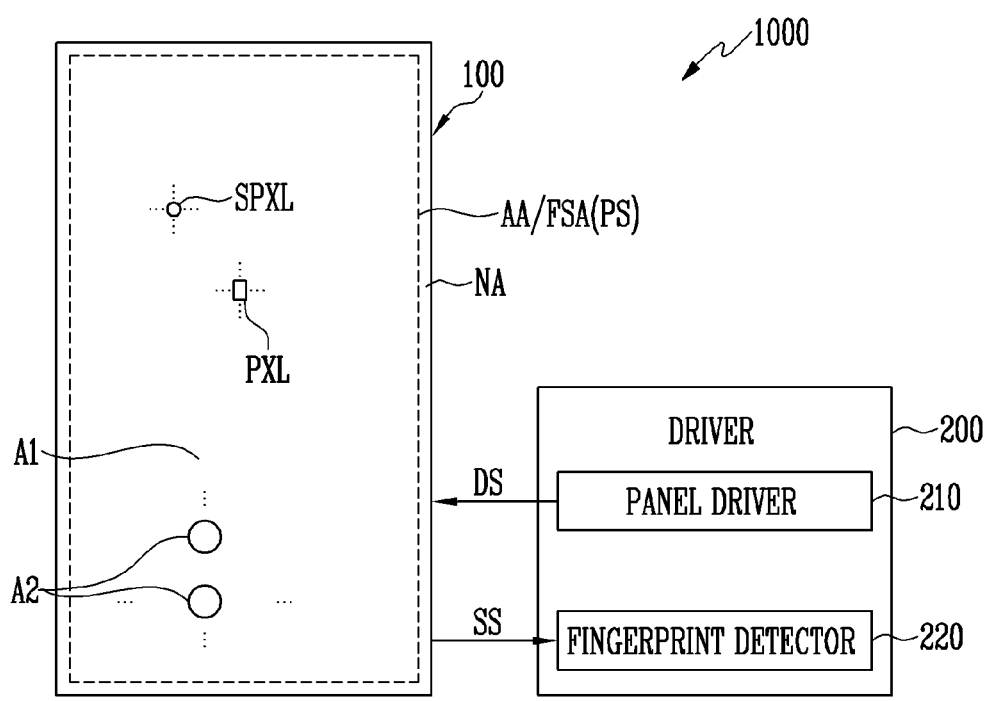

Hereinafter, example embodiments will be described in detail with reference to the accompanying drawings. The effects and characteristics of the present disclosure and a method of achieving the effects and characteristics will be clear by referring to the embodiments described below in detail together with the accompanying drawings. However, the present disclosure is not limited to the embodiments disclosed herein but may be implemented in various forms. The embodiments are provided by way of example only so that a person of ordinary skilled in the art can fully understand the features in the present disclosure and the scope thereof. Therefore, the present disclosure can be defined by the scope of the appended claims. Like reference numerals generally denote like elements throughout the specification.

Unless otherwise defined, terms (including technical and scientific terms) used herein have the meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. As used herein, the singular forms are intended to include the plural forms as well, unless the context clearly indicates otherwise.

FIGS. 1A and 1B are block diagrams schematically illustrating embodiments of a display device 1000. Referring to FIGS. 1A and 1B, the display device 1000 may include a display panel 100 and a driver 200. A case where a display panel 100 and a driver 200 are separated from each other is illustrated in FIGS. 1A and 1B. However, the present disclosure is not limited thereto. For example, all or a portion of the driver 200 may be integrally implemented with the display panel 100 on the display panel 100. All or a portion of the display device 1000 may have flexibility.

The display panel 100 includes a display area AA and a non-display area NA. The display area AA includes a plurality of pixels PXL (or sub-pixels) and may be referred to as an active area. In various embodiments, each pixel PXL may include at least one light emitting element. The display device 1000 drives the pixels PXL based on image data input from an external source to display an image in the display area AA.

In an embodiment, the display area AA may include a fingerprint sensing area FSA, which may include at least some pixels PXL among the pixels PXL in the display area AA. In the embodiment of FIG. 1A, at least a portion of the display area AA may be set as the fingerprint sensing area FSA. In the embodiment of FIG. 1B, all or a different portion of the display area AA may be set as the fingerprint sensing area FSA. When fingerprint sensing is performed, a fingerprint sensing operation may be performed on only a portion at which a touch of a user is substantially performed.

An example in which only one fingerprint sensing area FSA is formed in the display area AA is illustrated in FIG. 1A. However, the present disclosure is not limited thereto. In other embodiments, a plurality of fingerprint sensing areas FSA may be arranged regularly or irregularly in the display area AA. Also, an example is shown in which the fingerprint sensing area FSA is formed in at least a portion of the display area AA in FIG. 1A. However, the present disclosure is not limited thereto. In various embodiments, the display area AA and the fingerprint sensing area FSA may be provided to overlap with each other in only at least a partial area.

The non-display area NA may be disposed at the periphery of the display area AA and may be referred to as a non-active area. For example, the non-display area NA may include a line area, a pad area, various dummy areas, and the like.

In an embodiment, the display device 1000 may further include a plurality of sensor pixels SPXL in the fingerprint sensing area FSA. The sensor pixels SPXL may be configured as a photo sensor PS for sensing light. In an embodiment, when light emitted from a light source (or pixel PXL) in the display device 1000 is reflected by a finger FP (e.g., see FIG. 4C) of a user, the sensor pixels SPXL may sense the reflected light and output an electrical signal (e.g., a voltage signal) corresponding to the reflected light. The electrical signal may be transferred to the driver 200 (e.g., fingerprint detector 220) to be used for fingerprint sensing. An example in which the sensor pixels SPXL are used for fingerprint sensing is described in the present disclosure. However, in some embodiments the sensor pixels SPXL may additionally or alternatively be used to perform various functions of a touch sensor, a scanner, or the like.

When the sensor pixels SPXL are arranged in the fingerprint sensing area FSA on a plane, the sensor pixels SPXL may overlap with the pixels PXL or be disposed at the periphery of the pixels PXL. For example, some or all of the sensor pixels SPXL may overlap with the pixels PXL or be disposed between the pixels PXL. In various embodiments, the sensor pixels SPXL and the pixels PXL may have substantially the same size or different sizes. The relative size and arrangement between the sensor pixels SPXL and the pixels PXL may vary among embodiments.

When the sensor pixels SPXL are disposed adjacent to the pixels PXL or overlap with the pixels PXL at at least a portion, the sensor pixels SPXL may use, as a light source, the light emitting element in each pixel PXL. In such an embodiment, the sensor pixels SPXL and the light emitting elements in the pixels PXL may together constitute a photosensitive-type fingerprint sensor (or photo sensor PS). When a display device having a built-in fingerprint sensor is configured using the pixels PXL as light sources, without any external light source, the module thickness of the photosensitive-type fingerprint sensor and the display device having the same can be decreased, and manufacturing costs can be reduced.

In various embodiments, the sensor pixels SPXL may be arranged on another surface (e.g., a rear surface) facing one surface (e.g., a front surface) on which an image is displayed between both the surfaces of the display panel 100. However, the present disclosure is not limited thereto.

In some embodiments, the fingerprint sensing area FSA (or photo sensor PS) may include a first area A1 and a second area A2. A case where the second area A2 is surrounded by the first area A1 is illustrated in FIG. 1A. However, the second area A2 is not limited thereto and may be differently configured. Example embodiments of the arrangement of the first area A1 and the second area A2 are with reference to FIGS. 4A, 6A, and 7A.

A case where one second area A2 is located in the fingerprint sensing area FSA is illustrated in FIG. 1A. However, the second area A2 is not limited thereto. For example, as shown in FIG. 1B, a plurality of second areas A2 may be arranged in the fingerprint sensing area FSA according to a size of the fingerprint sensing area FSA.

When the photo sensor PS includes a first optical filter (or selective light blocking film) for blocking light of a specific wavelength range, the first optical filter is provided in the first area A1 and may not be provided in the second area A2. For example, the first optical filter may be a band pass filter which blocks light having a wavelength of about 600 nm or more (e.g., red light and infrared light) or about 500 nm or more (e.g., green light, red light, and infrared light), or which allows light of about 600 nm or less or about 500 nm or less to be transmitted therethrough.

Sensor pixels SPXL (or a portion of the photo sensor PS) in the first area A1 on a plane may sense light except a predetermined wavelength or wavelength range (e.g., sensor pixels SPXL in the first area A1 may sense light having a wavelength of about 600 nm or less or about 500 nm or less) or a light intensity corresponding thereto. Sensor pixels SPXL (or the other of the photo sensor PS) in the second area A2 on a plane may sense light including the predetermined wavelength or wavelength range (light including visible light and infrared light) or a light intensity corresponding thereto. For example, the first area A1 may be an area in which light of a specific wavelength range is blocked, and the second area A2 may be an area through which light of the specific wavelength range is transmitted. The aforementioned wavelengths, or wavelength ranges, may be different in other embodiments. For purposes of illustration and explanation, the wavelength or wavelength range of about 600 nm or more or about 500 nm or more may be referred to as a long wavelength or long wavelength range.

A case where a first optical filter is not provided in the second area A2 has been described. However, the present disclosure is not limited thereto. For example, although an embodiment will be described with reference to FIG. 5B, a second optical filter for allowing light of a specific wavelength range (e.g., a long wavelength of about 600 nm or more or about 500 nm or more) to be transmitted therethrough may be disposed in the second area A2. The sensor pixels SPXL (or the other of the photo sensor PS) in the second area A2 on a plane may sense light having the long wavelength or a light intensity corresponding thereto.

The driver 200 may drive the display panel 100. For example, the driver 200 may output a data signal DS corresponding to image data to the display panel 100. Also, the driver 200 may output a driving signal for the sensor pixels SPXL and may receive electrical signals (e.g., a sensing signal SS) from the sensor pixels SPXL. The driver 200 may detect a fingerprint shape of a user using the electrical signals and may detect a fake fingerprint.

In various embodiments, the driver 200 may include a panel driver 210 and a fingerprint detector 220. For convenience, a case where the panel driver 210 and the fingerprint detector 220 are separated from each other is illustrated in FIGS. 1A and 1B. However, the present disclosure is not limited thereto. For example, at least a portion of the fingerprint detector 220 may be integrated with the panel driver 210 or may operate in connection with the panel driver 210.

The panel driver 210 may supply a data signal DS corresponding to image data to the pixels PXL while sequentially scanning the pixels PXL of the display area AA. Then, the display panel 100 may display an image corresponding to the image data.

In an embodiment, the panel driver 210 may supply a driving signal for fingerprint sensing to the pixels PXL. The driving signal may be provided to allow the pixels PXL to operate as light sources for the sensor pixels SPXL by emitting lights. In such an embodiment, the driving signal for fingerprint sensing may be provided to pixels PXL in a specific area of the display panel 100, e.g., pixels PXL in fingerprint sensing area FSA.

In one embodiment, the driving signal for fingerprint sensing may be provided by the fingerprint detector 220.

The fingerprint detector 220 may transfer, to the sensor pixels SPXL, a driving signal (e.g., a driving voltage) for driving the sensor pixels SPXL, and may detect a fingerprint of a user based on electrical signals from the sensor pixels SPXL. For example, the fingerprint detector 220 may perform fingerprint authentication and fake fingerprint determination (e.g., perform a determination of whether the detected fingerprint is a fake fingerprint) based on a sensing signal SS supplied from the sensor pixels SPXL (e.g., photo sensors).

In some embodiments, the fingerprint detector 220 may determine whether the detected fingerprint is a fake fingerprint based on a first sensing signal supplied from the sensor pixels SPXL in the first area A1 and a second sensing signal supplied from the sensor pixels SPXL in the second area A2.

While the first sensing signal corresponding to the first area A1 does not include a light intensity of light of the specific wavelength range (e.g., light having a wavelength of about 600 nm or more or about 500 nm or more), the second sensing signal may include a light intensity of light of the specific wavelength range.

Further, when the finger FP of the user is in contact with the fingerprint sensing area FSA, the intensity of light in a specific wavelength range (which the second sensing signal supplied from one or more sensor pixels SPXL in the second area A2 in contact with the finger FP of the user includes) may be different from the intensity of light in the specific wavelength range which the second sensing signal supplied from one or more sensor pixels SPXL in the second area A2 that are not in contact with the finger FP of the user includes. This is because light in the specific wavelength range, which reaches the sensor pixel SPXL in the second area A2, has a transmission rate that is changed according to whether the finger FP of the user is in contact with the fingerprint sensing area FSA. The specific wavelength range may include light having wavelengths in a range of about 600 nm or more or about 500 nm or more, but the specific wavelength range may be different in another embodiment.

Therefore, the fingerprint detector 220 may determine whether the detected fingerprint is a fake fingerprint, based on one or more second sensing signals supplied from the sensor pixels SPXL in the second area A2 in contact with the finger FP and one or more second sensing signals supplied from the sensor pixels SPXL in the second area A2 that are not in contact with the finger FP.

In one embodiment, the fingerprint detector 220 may calculate a ratio of light (or light intensity) in the specific wavelength range. Also, the fingerprint detector 220 may estimate a color of the detected fingerprint (or target object or observation object) based on the ratio of the light in the specific wavelength range. Further, the fingerprint detector 220 may determine whether the detected fingerprint is a fake fingerprint based on the color of the detected fingerprint or the ratio of the light in the specific wavelength range.

For example, the display device 1000 (or fingerprint authentication device FDD) may sense light except that in the specific wavelength range (e.g., a long wavelength of about 600 nm or more or about 500 nm or more) through the first area A1, may sense light including that in the specific wavelength range through the second area A2, and then calculate a ratio of the light in the specific wavelength range or estimate a color of the detected fingerprint (or target object) based on light intensity (or first sensing signal) corresponding to the first area A1 and light intensity (or second sensing signal) corresponding to the second area A2. The display device 1000 (or fingerprint authentication device FDD) may then determine whether the detected fingerprint is a fake fingerprint based on the ratio of the light of the specific wavelength range or the color of the detected fingerprint.

Also, as described above, the display device 1000 (or fingerprint authentication device FDD) may sense light including light in the specific wavelength range (e.g., the long wavelength of about 600 nm or more or about 500 nm or more) through the second area A2 in contact with the finger FP, may sense the light of the specific wavelength range (e.g., the long wavelength of about 600 nm or more or about 500 nm or more) through the second area A2 not in contact with the finger FP, and then may calculate a transmission rate of the light in the specific wavelength range based on light intensity corresponding to the second area A2 in contact with the finger FP and light intensity corresponding to the second area A2 not in contact with the finger FP. The display device 1000 (or fingerprint authentication device FDD) may then determine whether the detected fingerprint is a fake fingerprint based on the transmission rate of the light in the specific wavelength range. As indicated, in one example embodiment the specific wavelength range may be about 600 nm or more or about 500 nm or more. A different wavelength range may be used in another embodiment.

The fingerprint detector 220 may determine that the detected fingerprint is a real fingerprint, for example, when the color of the detected fingerprint is a skin color, when the ratio of the light in the specific wavelength range is within a reference range, or when the transmission rate of the light in the specific wavelength range is within a reference range.

In one embodiment, the fingerprint detector 220 may determine that the detected fingerprint is a fake fingerprint when the color of the detected fingerprint is a single color (e.g., black, white or red), when the ratio of the light in the specific wavelength range is out of a reference range, or when the transmission rate in the light of the specific wavelength range is out of a reference range.

Figure 2A:
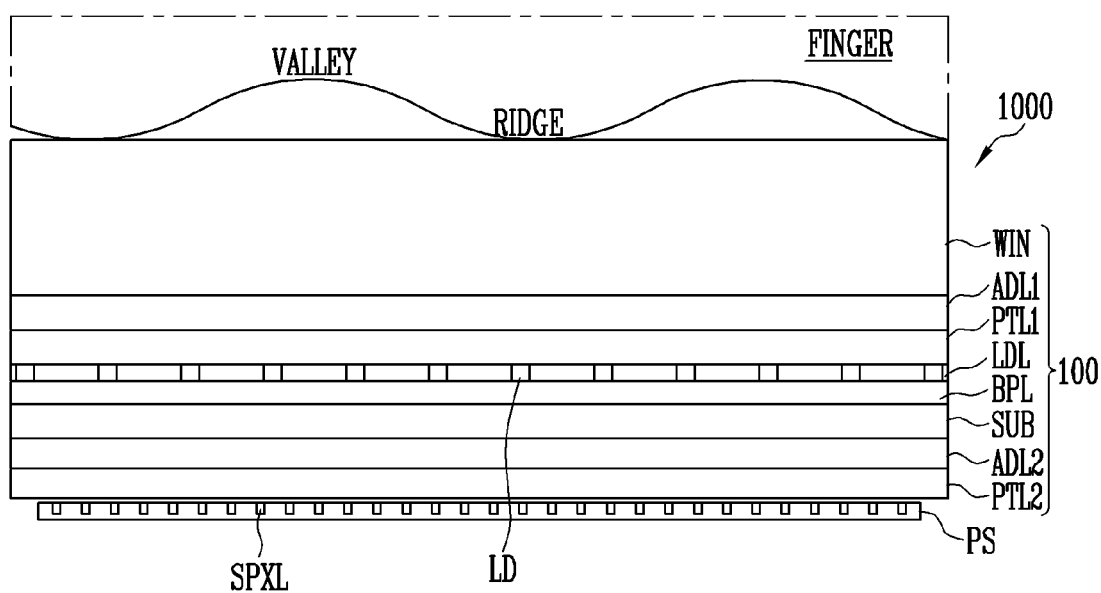
FIGS. 2A and 2B illustrate cross-sectional embodiments of a display device.

FIG. 2A is a sectional view illustrating an embodiment of the display device shown in FIG. 1A, e.g., FIG. 2A illustrates an example of a section in the fingerprint sensing area FSA of the display device 1000 shown in either of FIG. 1A or 1B.

Referring to FIGS. 1A to 2A, the display device 1000 may include the display panel 100 in the fingerprint sensing area FSA and a photo sensor PS disposed on one surface of the display panel 100. Also, the display device 1000 may include a circuit element layer BPL, a light emitting element layer LDL, a first protective layer PTL1, a first adhesive layer ADL1, and a window WIN sequentially disposed on one surface (e.g., an upper surface) of a substrate SUB. Also, the display device 1000 may include a second adhesive layer ADL2 and a second protective layer PTL2 sequentially disposed on another surface (e.g., a lower surface) of the substrate SUB in the fingerprint sensing area FSA.

The substrate SUB is a base substrate of the display panel 100 and may be a substantially transparent transmissive substrate. The substrate SUB may be a rigid substrate including glass or tempered glass, or a flexible substrate made of plastic. However, the material of the substrate SUB is not limited thereto, and the substrate SUB may be made of various other materials.

The circuit element layer BPL may be disposed on the one surface of the substrate SUB, and may include at least one conductive layer. For example, the circuit element layer BPL may include a plurality of circuit elements constituting pixel circuits of the pixels PXL and lines for supplying various power sources and signals for driving the pixels PXL. The circuit element layer BPL may include various types of circuit elements (such as at least one transistor and at least one capacitor) and a plurality of conductive layers for constituting lines connected to the circuit elements. Also, the circuit element layer BPL may include at least one insulating layer between the conductive layers.

The light emitting element layer LDL may be disposed on one surface of the circuit element layer BPL. The light emitting element layer LDL may include a plurality of light emitting elements LD connected to the circuit elements and/or the lines of the circuit element layer BPL through contact holes, etc. In an embodiment, at least one of the light emitting elements LD may be in each pixel PXL. For example, the light emitting element LD may be configured as an organic light emitting diode or an inorganic light emitting diode such as a micro light emitting diode or a quantum dot light emitting diode. In one embodiment, the light emitting element LD may be a light emitting element made of a combination of an organic material and an inorganic material. Further, each of the pixels PX includes a single light emitting element LD. In one embodiment, each of the pixels PX may include a plurality of light emitting elements coupled in parallel to each other, coupled in series to each other, or coupled in a series/parallel arrangement relative to each other.

Each of the pixels PXL may include circuit elements disposed in the circuit element layer BPL and at least one light emitting element LD disposed in the light emitting element layer LDL on the top of the circuit element layer BPL.

The first protective layer PTL1 may be disposed on the top of the light emitting element layer LDL to cover the display area AA. The first protective layer PTL1 may include an encapsulating member such as a thin film encapsulation (TFE) layer or an encapsulation substrate, and additionally may include a protective film and/or other features in addition to the encapsulating member.

The first adhesive layer ADL1 is disposed between the first protective layer PTL1 and the window WIN to allow the first protective layer PTL1 and the window WIN to be coupled with each other. The first adhesive layer ADL1 may include a transparent adhesive such as an optically clear adhesive (OCA), and may include various adhesive materials in addition to the transparent adhesive.

The window WIN is a protective member disposed at a module uppermost portion of the display device 1000 including the display panel 100, and may include substantially a transparent transmissive substrate. The window WIN may have a multi-layered structure including, for example, a glass substrate, a plastic film, and/or a plastic substrate. The window WIN may include a rigid or flexible substrate, and the material constituting the window WIN may be made from various materials.

In various embodiments, the display device 1000 may further include a polarizing plate, an anti-reflective layer, and/or a touch sensor layer (touch electrode layer). For example, the display device 1000 may further include a polarizing plate and/or a touch sensor layer disposed between the first protective layer PTL1 and the window WIN.

The touch sensor layer may include a plurality of sensing electrodes (or sensing cells). The driver 200 described with reference to FIG. 1A may sense whether a touch input occurs and a position (or coordinate) of the touch input based on a change in capacitance between the sensing electrodes.

The second protective layer PTL2 may be disposed on the other surface of the substrate SUB. The second protective layer PTL2 may be coupled to the substrate SUB by the second adhesive layer ADL2.

The second adhesive layer ADL2 may allow the substrate SUB and the second protective layer PTL2 to be firmly coupled (or attached) to each other. The second adhesive layer ADL2 may include a transparent adhesive such as an OCA. The second adhesive layer ADL2 may include a pressure sensitive adhesive (PSA) in which an adhesive material acts when pressure for allowing the second adhesive layer ADL2 to be adhered to an adhesive surface is applied.

The second protective layer PTL2 prevents oxygen and moisture from being introduced thereto from the outside, and may be provided in the form of a single layer or multi-layer. The second protective layer PTL2 may be configured in a film form to further ensure flexibility of the display panel 100. The second protective layer PTL2 may be coupled to the photo sensor PS through another adhesive layer including a transparent adhesive such as an OCA.

The photo sensor PS is attached to the other surface (e.g., the rear surface) of the display panel 100 through an adhesive or the like to overlap with at least one area of the display panel 100. For example, the photo sensor PS may be disposed to overlap with the display panel 100 in the fingerprint sensing area FSA. The photo sensor PS may include a plurality of sensor pixels SPXL distributed at a predetermined resolution and/or a predetermined distance.

In some embodiments, the photo sensor PS may include a first optical filter (or selective light blocking film) for blocking light of a specific wavelength range (e.g., a long wavelength of about 600 nm or more or about 500 nm or more).

A case where the first optical film is provided in the photo sensor PS is described. However, the present disclosure is not limited thereto. For example, the first optical film may be provided on the bottom of the second protective layer PTL2. For example, when the first optical film is on top of the sensor pixels SPXL, the first optical film may be in the photo sensor PS or may be separately disposed outside the photo sensor PS.

In an embodiment, an optical system which provides a light path (by concentrating lights advancing toward the photo sensor PS) may be provided on the photo sensor PS. In the optical system, the width of a light transmitting part for guiding light may be determined based on sensing precision and/or light conversion efficiency considerations. The concentration ratio of lights incident to the photo sensor PS can be improved by the optical system. In some embodiments, the optical system may be formed of optical fiber, silicon, etc.

The sensor pixels SPXL may have an appropriate (predetermined) number, an appropriate (predetermined) size, and an appropriate (predetermined) arrangement such that a fingerprint image to be identifiable from electrical signals output by the sensing pixels SPXL can be generated. The distance between the sensor pixels SPXL may be densely set such that reflected light reflected from an object to be observed (e.g., a fingerprint or the like) can be incident on at least two adjacent sensor pixels SPXL.

The sensor pixels SPXL may output a corresponding electrical signal, e.g., a voltage signal by sensing external light. Reflected lights received by respective sensor pixels SPXL may have optical properties (e.g., frequencies, wavelengths, sizes, etc.) caused by valleys and ridges of a fingerprint of a finger FP of the user. Therefore, the sensor pixels SPXL may output a sensing signal SS having different electrical characteristics corresponding to the optical properties of the reflected lights.

In an embodiment, the sensing signal SS output by the sensor pixels SPXL may be converted to data by the fingerprint detector 220, to be used for fingerprint identification (e.g., fingerprint authentication) of the user. In addition, the fingerprint detector 220 may calculate a ratio of the light in the specific wavelength range, and/or estimate the color of a detected fingerprint, based on the sensing signal SS. The fingerprint detector 220 may then detect a fake fingerprint based on the calculated ratio and/or the estimated color.

Figure 2B:
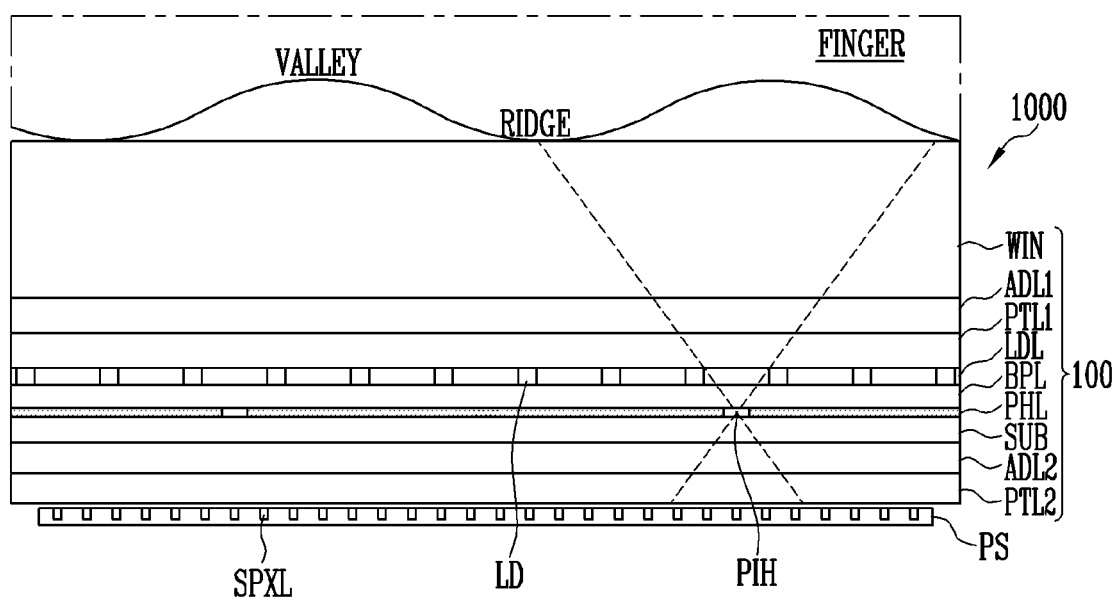

FIG. 2B is a sectional view illustrating an embodiment of the display device of FIG. 1A, e.g., FIG. 2B illustrates an example of the section in the fingerprint sensing area FSA of the display device 1000 shown in FIGS. 1A and 1B.

Referring to FIGS. 1A, 2A, and 2B, in one embodiment the display device 1000 may further include a light blocking layer PHL including pin holes PIH. The light blocking layer PHL may be disposed in the display panel 100 or between the display panel 100 and the sensor pixels SPXL, to block some light incident to the sensor pixels SPXL. For example, some light incident to the light blocking layer PHL may be blocked, and other portions of the light may reach the sensor pixels SPXL under the light blocking layer PHL by passing through the pin holes PIH. The pin holes PIH operate as an optical system and in some embodiments may be used together with another optical system.

Each of the pin holes PIH may be, for example, an optical hole such as a kind of light passing hole. For example, the pin hole PHI may be a light passing hole having a predetermined (e.g., smallest) size (area) among light passing holes disposed when layers of the display device 1000 overlap with each other. The pin hole PH may be disposed on a path along which reflected light passes through the display panel 100 in an oblique direction or vertical direction and then is incident to the sensor pixels SPXL.

The pin holes PIH may have a predetermined width, e.g., a width in a range of 5 μm to 20 μm. In this manner, the width of an optical opening area, which is to be secured in each layer of the display device 1000, may gradually increase to become more distant from the light blocking layer PHL (e.g., approaching the top and bottom of the light blocking layer PHL).

In one embodiment, the width (or diameter) of the pin holes PIH may be set to about ten times longer than the wavelength of reflected light, e.g., about 4 µm or 5 µm or more so as to prevent diffraction of light. Also, the width of the pin holes PIH may be set to a size large enough to prevent image blur and to more clearly sense the shape of a fingerprint. For example, the width of the pin holes PIH may be set to about 15 µm or less. However, the present disclosure is not limited thereto, and the width of the pin holes PIH may be changed depending, for example, on the wavelength band of reflected light and/or the thickness of a module for each layer.

Only reflected light passing through the pin holes PIH may reach the sensor pixels SPXL. The phase of light reflected from a fingerprint (and passing through the pin hole PIH having a very narrow width) and the phase of an image formed in the photo sensor PS, may have a predetermined difference, e.g., a difference of 180 degrees.

The sensor pixels SPXL may output a sensing signal SS, e.g., a voltage signal corresponding reflected light received thereto.

The features of the present embodiment are merely illustrative. The configuration, arrangement, driving method, etc., of a photo sensor for detecting light reflected from a fingerprint may be different from the photo sensor PS shown in FIG. 2A or 2B in another embodiment. Also, although a pin-hole type photo sensor is illustrated in FIG. 2B, the present disclosure is not limited thereto. For example, a micro-lens type photo sensor or a collimator type photo sensor may be used as the photo sensor PS in another embodiment.

Figure 3A:
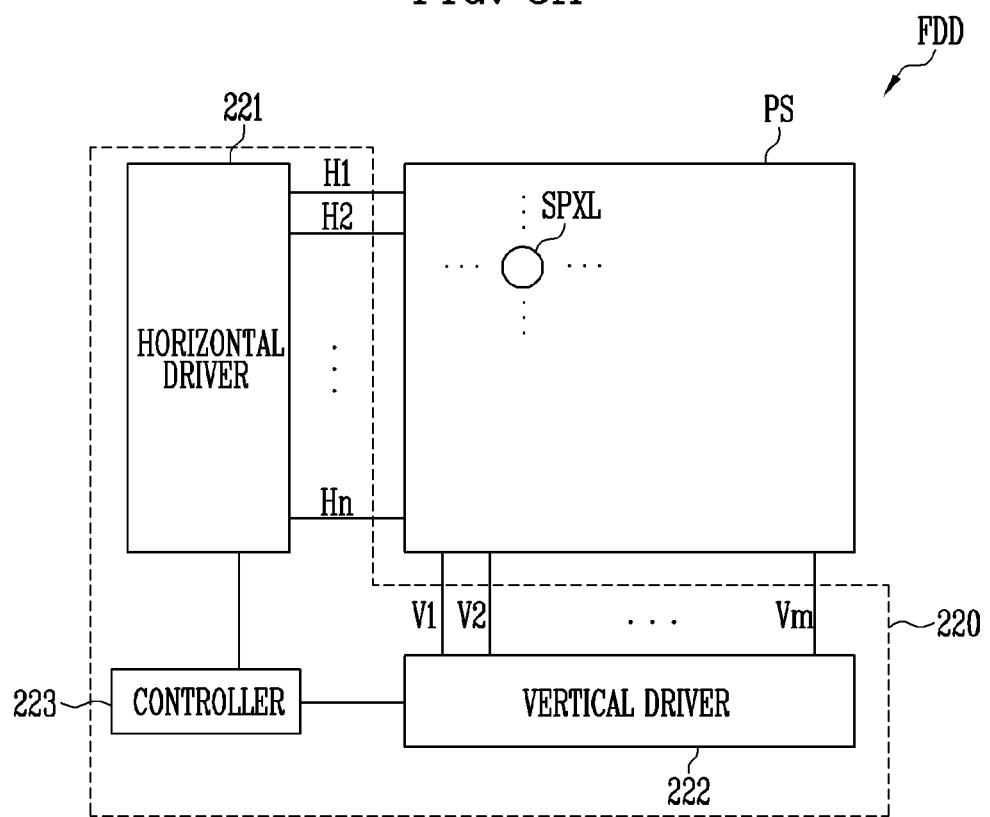
FIG. 3A illustrates an embodiment of a fingerprint authentication device in the display device of FIG. 1A.

FIG. 3A is a block diagram illustrating an embodiment of a configuration of the fingerprint authentication device in the display device shown in FIG. 1A, e.g., FIG. 3A illustrates an example of the fingerprint authentication device FDD in the display device 1000 shown in FIGS. 1A and 1B.

Referring to FIGS. 1A to 3A, the fingerprint authentication device FDD may include a photo sensor PS and a fingerprint detector 220. The photo sensor PS may include an array of sensor pixels SPXL. In an embodiment, the sensor pixels SPXL may be arranged in a two-dimensional array, but the present disclosure is not limited thereto. Each of the sensor pixels SPXL may include a photoelectric element which converts incident light to electric charges according to a light intensity of the light.

The fingerprint detector 220 may include a horizontal driver 221, a vertical driver 222, and a controller 223. The horizontal driver 221 may be connected to the sensor pixels SPXL through driving lines H1 to Hn. The horizontal driver 221 may be configured, for example, as a shift register, an address decoder, or the like. In various embodiments, the horizontal driver 221 may apply a driving signal to drive selected sensor pixels SPXL among the sensor pixels SPXL. For example, the horizontal driver 221 may apply a driving signal in a unit of a sensor pixel row.

Sensor pixels SPXL selected and driven by the horizontal driver 221 sense light using photoelectric elements provided therein, The sensor pixels SPXL may then output an electrical signal (sensing signal SS), e.g., a voltage signal corresponding to the sensed light. The output electrical signal may be an analog signal.

The vertical driver 222 may be connected to the sensor pixels SPXL through signal lines V1 to Vm, and may perform processing on a signal output from the sensor pixels SPXL. For example, the vertical driver 222 may perform Correlated Double Sampling (CDS) processing for removing noise from a received electrical signal. Also, the vertical driver 222 may convert an analog signal from the sensor pixel SPXL to a digital signal. In an embodiment, an analog-digital converter may be provided for each sensor pixel column, to process in parallel analog signals received from the sensor pixel columns.

The controller 223 may control the horizontal driver 221 and a vertical driver 222. In an embodiment, the controller 223 may generate data corresponding to the sensing signal SS received from the vertical driver 222, and may perform processing on the generated data. In an embodiment, the controller 223 may detect a fingerprint from the processed data or may authenticate the detected fingerprint and/or transmit the detected fingerprint to an external destination. For example, the controller 223 may include at least some of components in a fingerprint detector 220 shown in FIGS. 8A and 8B, and/or may perform functions of at least some of the components. However, this is merely illustrative. In one embodiment, generation of data and fingerprint detection may not be performed by the controller 223, but rather may be performed by an external host processor, etc.

Figure 3B:
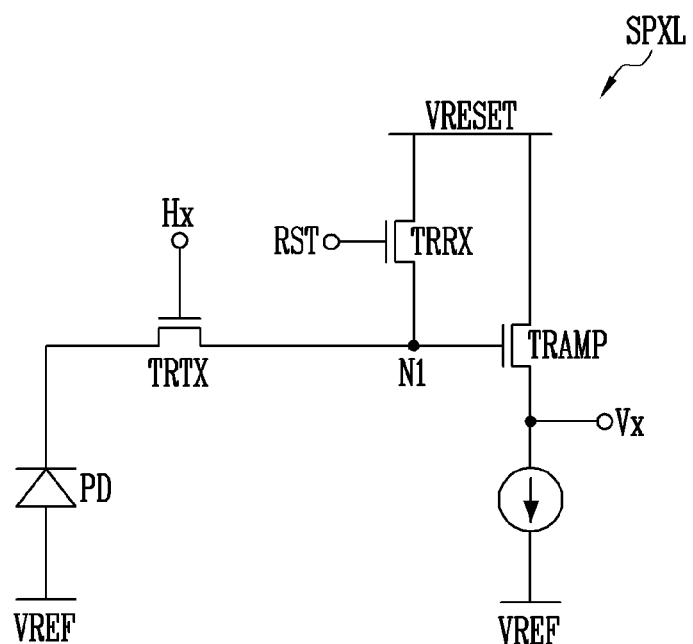
FIG. 3B illustrates an embodiment of a sensor pixel in the fingerprint authentication device of FIG. 3A.

FIG. 3B is a circuit diagram illustrating an embodiment of the sensor pixel in the fingerprint authentication device shown in FIG. 3A. In FIG. 3B, the sensor pixel SPXL disposed on an xth (x is a positive integer) sensor pixel row and an xth sensor pixel column is illustrated.

Referring to FIGS. 3A and 3B, the sensor pixel SPXL includes a photo diode PD as an example of the photoelectric device, a transmission transistor TRTX, a reset transistor TRRX, and an amplification transistor TRAMP. In FIG. 3B, an example in which the transistors are implemented with an N-type transistor is illustrated. However, in various embodiments, at least some of the transistors may be implemented with a P-type transistor and in this case the circuit structure of the sensor pixel SPXL may be modified in a corresponding manner.

A specific voltage VREF may be applied to the anode electrode of the photo diode PD. In an embodiment, the anode electrode of the photo diode PD may be grounded or coupled to some other reference voltage. The transmission transistor TRTX is connected between the cathode electrode of the photo diode PD and a first node N1, and the gate electrode of the transmission transistor TRTX is connected to the horizontal driver 221. The transmission transistor TRTX is turned on when a driving signal is applied through a driving line Hx, to operate as a transmission gate unit that transfers electric charges converted from light in the photo diode PD to the first node N1 as an electric charge voltage converter.

The reset transistor TRRX is connected between a reset power source VRESET and the first node N1, and may receive a reset signal applied through a gate electrode connected to a reset line RST. The reset transistor TRRX is turned on when the reset signal is applied, to reset a voltage of the first node N1 as a voltage of the reset power source VRESET.

The amplification transistor TRAMP is connected between the reset power source VRESET and a signal line Vx, and a gate electrode of the amplification transistor TRAMP is connected to the first node N1. The amplification transistor TRAMP operates as an amplifier that outputs a signal corresponding to the voltage of the first node N1 to the signal line Vx.

In various embodiments, the structure of the sensor pixel SPXL is not limited to that described above, and the sensor pixel SPXL may include, for example, four or more transistors or two or less transistors.

Figure 4A:
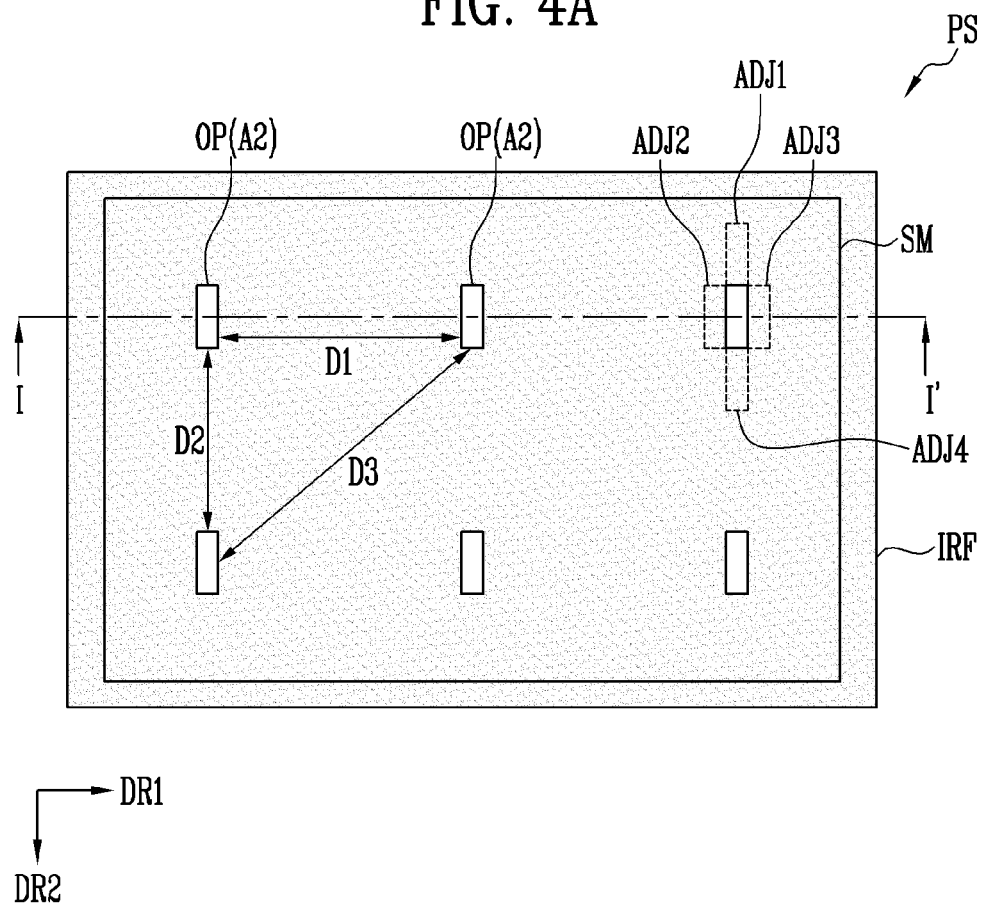
FIG. 4A illustrates an embodiment of a photo sensor in the display device of FIG. 1A.
Figure 4B:
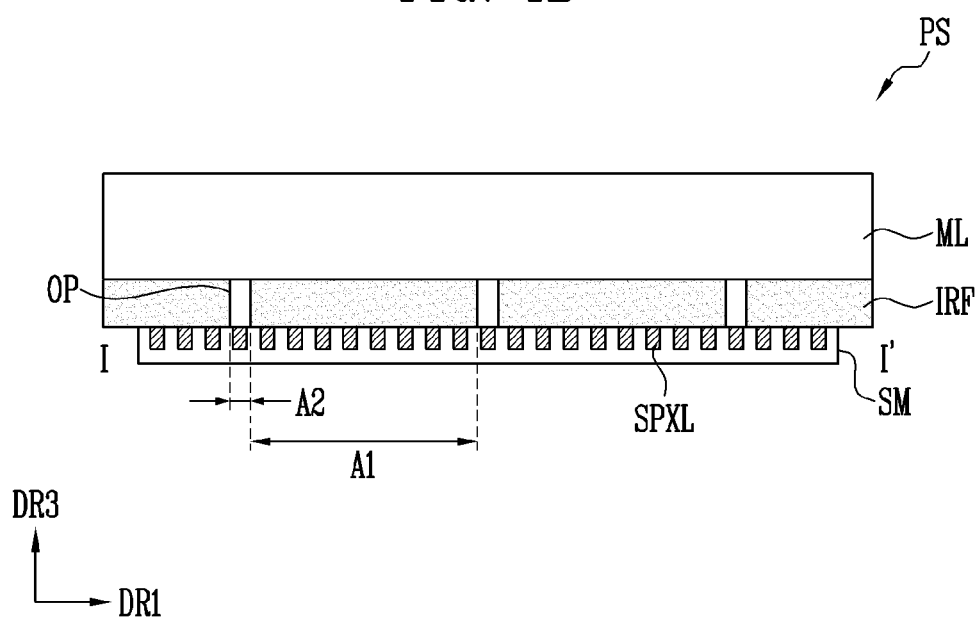
FIG. 4B illustrates an embodiment of the photo sensor taken along line I-I' in FIG. 4A.

FIG. 4A is a plan view illustrating an embodiment of the photo sensor in the display device shown in FIG. 1A. In this embodiment, the photo sensor PS is provided in the fingerprint sensing area FSA of the display device shown in FIGS. 1A and 1B. FIG. 4B is a sectional view illustrating an embodiment of the photo sensor taken along line I-I' shown in FIG. 4A.

Referring to FIGS. 1A, 4A, and 4B, the photo sensor PS may include a sensor module (or sensor) SM and a first optical filter IRF. Also, the photo sensor PS may include an optical lens ML. The sensor module SM may include sensor pixels SPXL and may include a first area A1 and a second area A2 on a plane. In an embodiment, as shown in FIG. 4A, a plurality of second areas A2 may be disposed to be spaced apart from each other along a first direction DR1 and a second direction DR2, and the first area A1 may surround the second areas A2. The first area A1 may be other areas except the second areas A2 in the fingerprint sensing area FSA (e.g., see FIG. 1).

The first optical filter IRF may be disposed on the sensor module SM and may overlap with the sensor module SM in the first area A1, and may not overlap with the sensor module SM in the second area A2. The first optical filter IRF may block light of a first wavelength range. The first optical filter IRF may block light having a wavelength, for example, of about 500 nm or more or about 600 nm or more.

In some embodiments, openings OP corresponding to the second areas A2 may be formed in the first optical filter IRF. On a plane, the openings OP may respectively overlap with the second areas A2, e.g., the second areas A2 may be defined by the openings OP formed in the first optical filter IRF.

In an embodiment, the openings OP may be disposed to be spaced apart from each other at a predetermined separation distance on a plane, such that at least one of the openings OP corresponds to a detected fingerprint. As shown in FIG. 4A, the openings OP may be disposed to be spaced apart from each other at a first separation distance D1 in the first direction DR1. Also, the openings OP may be disposed to be spaced apart from each other at a second separation distance D2 in the second direction DR2 perpendicular to or otherwise crossing the first direction DR1. The openings OP may be disposed to be spaced apart from each other at a third separation distance D3 in an oblique direction intersecting each of the first direction DR1 and the second direction DR2.

For example, when a finger PF of the user touches the photo sensor PS (or the display device 1000, e.g., see FIG. 4C, including the photo sensor PS), the finger FP of the user may be in contact with the photo sensor PS and an area sensed by the photo sensor PS may have a diameter of, for example, about 1.5 cm. The first separation distance D1, the second separation distance D2, and the third separation distance D3 may be substantially the same as 1.5 cm, or may be set in a range of about 1 cm or less which is less than 1.5 cm. Accordingly, the area in which the finger FP of the user is in contact with the photo sensor PS or is sensed by the photo sensor PS may correspond to at least one opening OP on a plane or include at least one opening OP. Thus, whether the detected fingerprint is a fake fingerprint can be determined regardless of the position at which the finger FP of the user touches the photo sensor PS.

Although 6 openings arranged in the first direction DR1 and DR2 are illustrated in FIG. 4A, this is merely illustrative and also the openings OP are not limited thereto. For example, the number of openings OP may increase as the size of the photo sensor PS on a plane becomes larger. The number of openings OP may decrease as the size of the photo sensor PS on a plane becomes less. In one embodiment, the openings OP may have substantially the same separation distance and may be located, for example, at vertices of a virtual equilateral triangle.

In an embodiment, an area of the openings OP may be about 10% or less, about 5% or less, about 3% or less, or about 1% or less of that of the first optical filter IRF. As will be described with reference to FIG. 4C, light incident to the sensor module SM through the openings OP may include noise, and hence the accuracy of fingerprint sensing may become lowered as the area of the openings OP becomes larger.

The first optical filter IRF may cover the sensor module SM on a plane. As shown in FIG. 4A, the first optical filter IRF may protrude in the first direction DR1 and the second direction DR2 from an edge of the sensor module SM. Light having a long wavelength, and which is incident in an oblique direction (e.g., an oblique direction in which light is incident through the pin holes PIH described, for example, with reference to FIG. 2B), may be blocked. In one or more embodiments described herein, light having a long wavelength may correspond to, for example, a wavelength of about 600 nm or more or about 500 nm or more. However, the embodiments described here may be used with other wavelengths, which, for example, are not necessarily considered to be long, but rather may correspond to other predetermined wavelengths outside the aforementioned range.

The optical lens ML is an optical system and may be disposed on the first optical filter IRF. The optical lens ML may condense light toward the sensor module SM (or the sensor pixels SPXL). For example, the optical lens ML may include convex lenses having a micro size. Although the optical lens ML has been described as the optical system, the optical system is not limited thereto. For example, a pin hole or collimator may be applied to the optical system, or an optical system in which the optical lens ML, the pin hole, the collimator, and the like are combined or stacked may be applied to the optical system.

The optical lens ML may overlap with the first area A1 and the second area A2 on a plane, and the size of the optical lens ML on a plane may be substantially equal to that of the first optical filter IRF on the plane. An embodiment where light is sensed in the first area A1 of the sensor module SM and light is sensed in the second area A2 of the sensor module SM is described with reference to FIG. 4C.

Figure 4C:
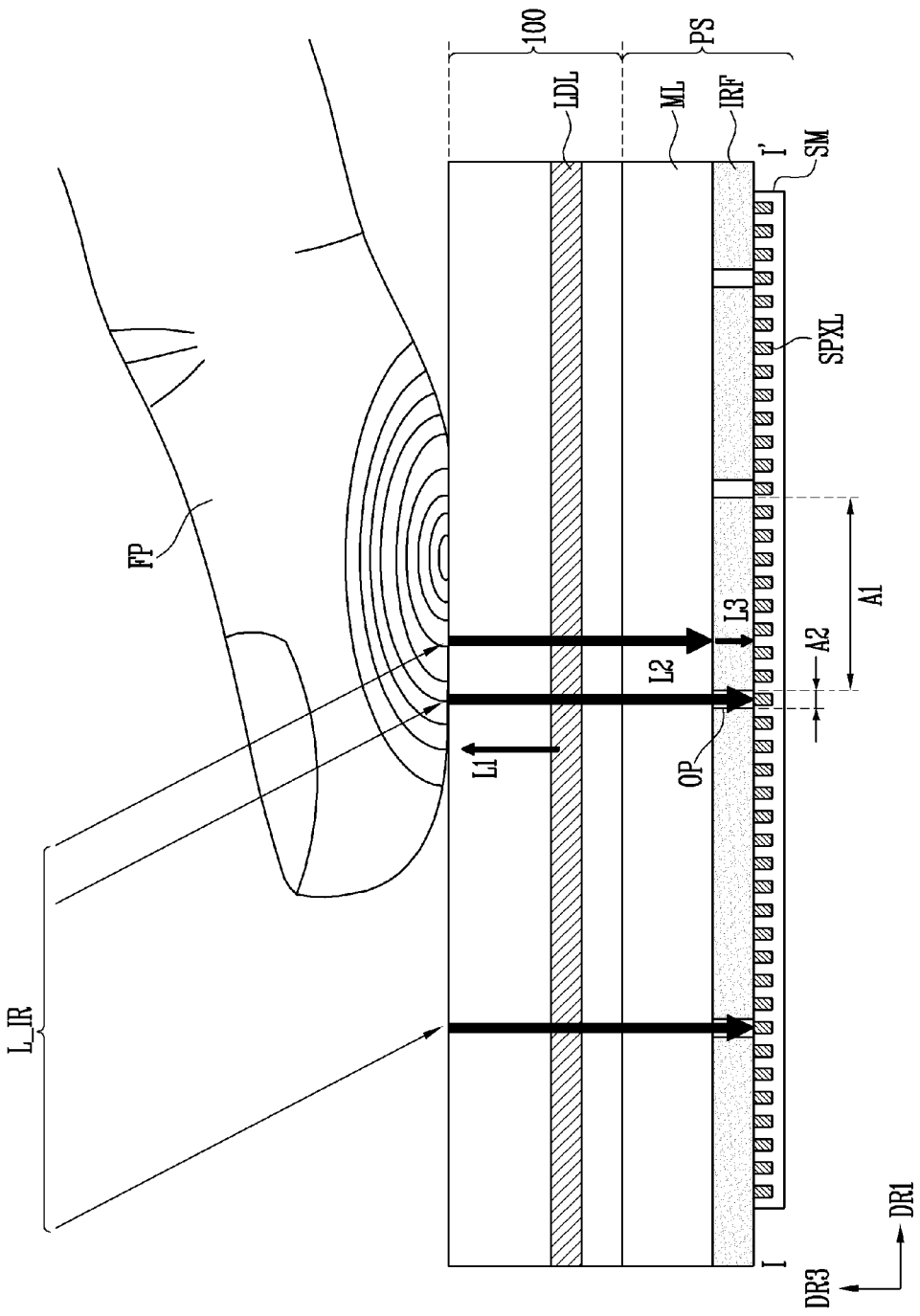
FIG. 4C illustrates an embodiment of light incident to a first area and a second area of the photo sensor of FIG. 4B.

FIG. 4C is a view illustrating an embodiment where light is incident to the first area and the second area of the photo sensor shown in FIG. 4B. In addition to the photo sensor PS shown in FIG. 4B, the display panel 100 and the window WIN, which are described with reference to FIGS. 2A and 2B, are further illustrated in FIG. 4C. Although a case where one sensor pixel SPXL corresponds to the second area A2 is illustrated in FIG. 4C, this is illustrated for convenience and a plurality of sensor pixels SPXL may correspond to the second area A2 in one or more embodiments.

Referring to FIGS. 2A, 2B, and 4A to 4C, first light L1 may be emitted toward the finger PF of the user (or target object) from the light emitting element layer LDL in the display panel 100. For example, the first light L1 may be visible light in a predetermined range, e.g., of about 400 nm to about 700 nm. When the light emitting element layer LDL includes a red pixel emitting red light, a green pixel emitting green light, and a blue pixel emitting blue light, the first light L1 may include red light, green light, and blue light.

At least a portion of the first light L1 may be reflected by the finger FP of the user. In addition, external light L_IR (e.g., red light and infrared light) having a long wavelength (e.g., of about 600 nm or more) may be transmitted through the finger FP of the user from the outside and then incident into the display panel 100. Therefore, second light L2 advancing toward the photo sensor PS from the finger FP of the user may include at least a portion of the first light L1 and the external light L_IR. For example, the external light L_IR may be included as noise in the second light L2, and the light intensity of the second light L2 may be substantially equal to the sum of a light intensity of the first light L1 and a light intensity of the external light L_IR.

Since the first optical filter IRF is disposed in the first area A1, light of a wavelength band (which corresponds to the external light L_IR) may be blocked from the second light L2, and a portion of the sensor module SM located in the first area A1 may sense third light L3. For example, the third light L3 may include light having a predetermined wavelength, e.g., of about 600 nm or less or about 500 nm or less.

When the first optical filter IRF is entirely disposed on the sensor module SM, the sensor module SM receives only the third light L3 including substantially no noise. Accordingly, valleys and ridges of a fingerprint can be accurately distinguished from each other and the accuracy of fingerprint sensing can be improved. However, the sensor module SM can sense only light having a wavelength of about 600 nm or less (e.g., blue light and green light) or about 500 nm or less, and may not sense light having a wavelength of about 600 nm or more (e.g., red light) or about 500 nm or more. Therefore, a color of the finger (or target object) of the user may not be estimated, and fake fingerprint determination based on the color may not be performed. In other cases, the first optical filter IRF may be only partially disposed on the sensor module SM, In accordance with one embodiment, in the photos sensor PS the openings OP are formed in the first optical filter IRF, corresponding to the second area A2, a portion of the sensor module SM located in the second area A2 may sense the second light L2, including light having the wavelength of about 600 nm or more (e.g., red light) or about 500 nm or more. Therefore, although noise is partially included, the ratio of light having a long wavelength may be calculated based on the light intensity of the third light L3 in the first area A1 and the second light L2 in the second area A2, and a color of the finger FP of the user (or target object) may be estimated based on the calculated ratio of the light having the long wavelength. Thus, fake fingerprint determination may be performed based on the ratio of the light having the long wavelength and/or the estimated color. In addition, the area of the second area A2 may be significantly less than that of the first area A1. As a result, the accuracy of fingerprint sensing may be hardly deteriorated.

In addition, at a portion of the sensor module SM which is located in the second area A2 not in contact with the finger FP of the user, external light L_IR (e.g., red light and infrared light) having a long wavelength (e.g., of about 600 nm or more or about 500 nm or more) is not transmitted through the finger FP of the user from the outside, but may be incident to the display panel 100. In accordance with one embodiment, in the photo sensor PS the opening OP is formed in the first optical filter IRF corresponding to the second area A2, and hence a portion of the sensor module SM located in the second area A2 may sense the external light L_IR (e.g., red light and infrared light) which is not transmitted through the finger FP.

The light intensity of the external light L_IR (e.g., red light and infrared light), which the portion of the sensor module SM located in the second region A2 in contact with the finger FP senses in the second light L2, and the light intensity of the external light L_IR (e.g., red light and infrared light), which the portion of the sensor module SM located in the second area A2 not in contact with the finger FP senses, are different from each other.

Therefore, the transmission rate Tri of light having the long wavelength may be calculated based on both light intensities, e.g., the light intensity of the external light L_IR (e.g., red light and infrared light) which the portion of the sensor module SM located in the second region A2 in contact with the finger FP senses in the second light L2 and the light intensity of the external light L_IR (e.g., red light and infrared light) which the portion of the sensor module SM located in the second area A2 not in contact with the finger FP senses. As a result, fake fingerprint determination may be performed based on the calculated transmission rate Tri of the light having the long wavelength. Embodiments of the first through fourth adjacent areas ADJ1, ADJ2, ADJ3, and ADJ4 will be described with reference to FIGS. 8A and 8B.

As described above, the sensor module SM includes the first area A1 and the second area A2 on a plane. The first optical filter IRF overlaps with the first area A1 but may not overlap with the second area A2. Therefore, whether a detected fingerprint is a fake fingerprint may be determined based on the first sensing signal corresponding to the first area in which light of the first wavelength range is blocked and the second sensing signal corresponding to the second area A2 in which light of the first wavelength range is transmitted.

Also, as described above, the transmission rate of light having a specific wavelength may be calculated based on two sensing signals, namely the second sensing signal which the sensor module SM located in the second area A2 in contact with the finger FP senses and the second sensing signal which the sensor module SM located in the second area A2 not in contact with the finger FP senses. Whether a detected fingerprint is a fake fingerprint may then be determined based on the calculated transmission rate of the light having the specific wavelength.

The arrangement of the openings OP shown in FIG. 4A and the stacking structure of the photo sensor PS shown in FIG. 4B are merely illustrative. The photo sensor PS may have a different arrangement of opening OP and/or a different stacking structure in another embodiment. Various embodiments of the photo sensor PS are described with reference to FIGS. 5A to 7C.

Figure 5A:
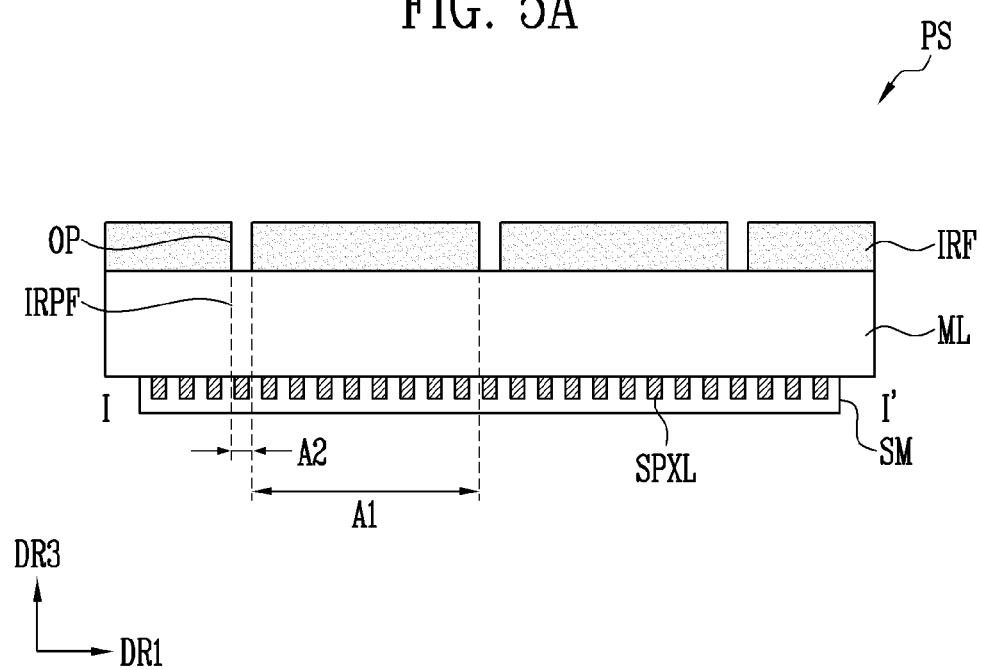
FIGS. 5A-5C illustrate embodiments of sectional views of the photo sensor taken along the line I-I' shown in FIG. 4A.
Figure 5B:
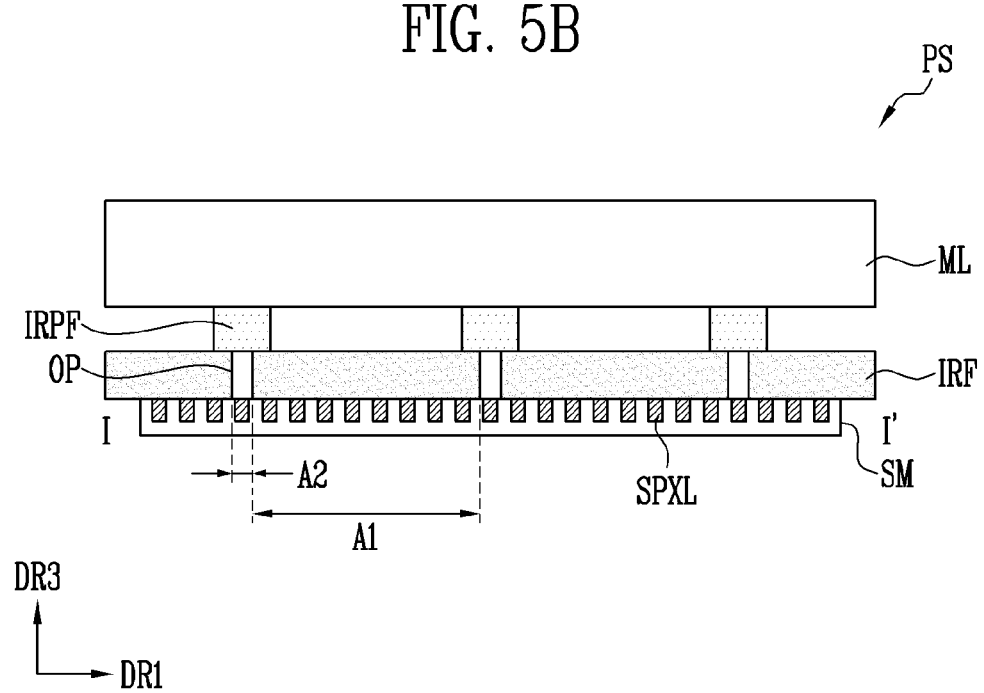
Figure 5C:
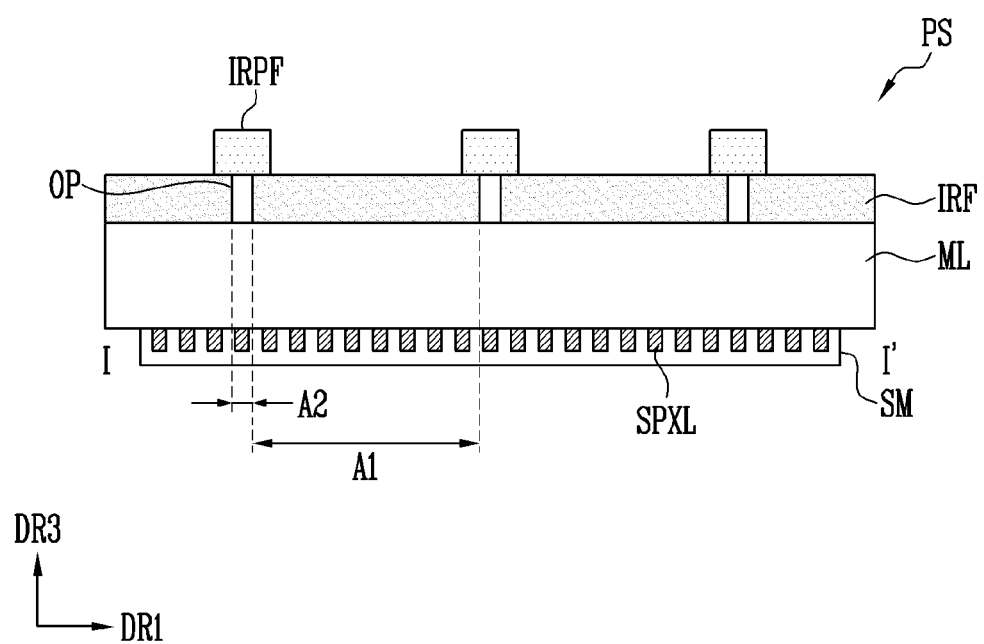

FIGS. 5A to 5C are sectional views illustrating various embodiments of the photo sensor taken along the line I-I' shown in FIG. 4A. Drawings corresponding to FIG. 4B are illustrated in FIGS. 5A, 5B, and 5C.

Referring to FIGS. 4A, 4B and 5A to 5C, each of photo sensors PS shown in FIGS. 5A to 5C may be substantially the same or similar to the photo sensor PS shown in FIG. 4B, except for an arrangement position of the optical filter ML and a second optical filter IRPF.

As shown in FIG. 5A, the optical lens ML may be disposed between the first optical filter IRF and the sensor module SM. The optical lens ML may be disposed on the sensor module SM, and the first optical filter IRF may be disposed on the optical lens ML. The first optical filter IRF may be formed or coated on the optical lens ML, for example, through a deposition process. The first optical filter IRF may be implemented in the form of a separate film to be attached on a top surface of the optical lens ML.

As shown in FIG. 5B, the photo sensor PS may further include the second optical filter IRPF disposed between the optical lens ML (or the display panel 100 shown in FIG. 4C) and the sensor module SM. The second optical filter IRPF overlaps with the second area A2 and may hardly overlap with the first area A1. The second optical filter IRPF may allow only light of the first wavelength range to be transmitted therethrough. In an embodiment, the second optical filter IRPF may allow only light having a long wavelength (e.g., of about 600 nm or about 500 nm or more) to be transmitted therethrough.

A portion of the sensor module SM located in the second area A2 may sense only light having the long wavelength of about 600 nm or about 500 nm or more. A difference operation between the second sensing signal corresponding to the second area A2 and the first sensing signal corresponding to the first area A1 may exist to calculate the light intensity of red light in the structure shown in FIG. 4B. On the other hand, any operation for calculating light intensity of the light having the long wavelength in the structure shown in FIG. 5B may not be performed, and a process for performing fake fingerprint determination can be simplified to a greater degree.

In addition, even when the second optical filter IRPF exists, light having the long wavelength (e.g., of about 600 nm or more or about 500 nm) may be sensed through the second area A2 in contact with the finger FP. Also, light having the long wavelength (e.g., of about 600 nm or more or about 500 nm) may be sensed through the second area A2 not in contact with the finger FP. The light intensity of the light having the wavelength sensed through the second area A2 in contact with the finger FP and the light intensity of the light having the wavelength sensed through the second area A2 not in contact with the finger FP are different from each other. Thus, the transmission rate of light having the long wavelength may be calculated, and whether a detected fingerprint is a fake fingerprint may be determined based on the calculated transmission rate of the light having the long wavelength.

The second optical filter IRPF may also be applied to the photo sensor PS shown in FIG. 5A. As shown in FIG. 5C, the optical lens ML, the first optical filter IRF, and the second optical filter IRPF may be sequentially stacked on the sensor module SM.

Figure 6A:
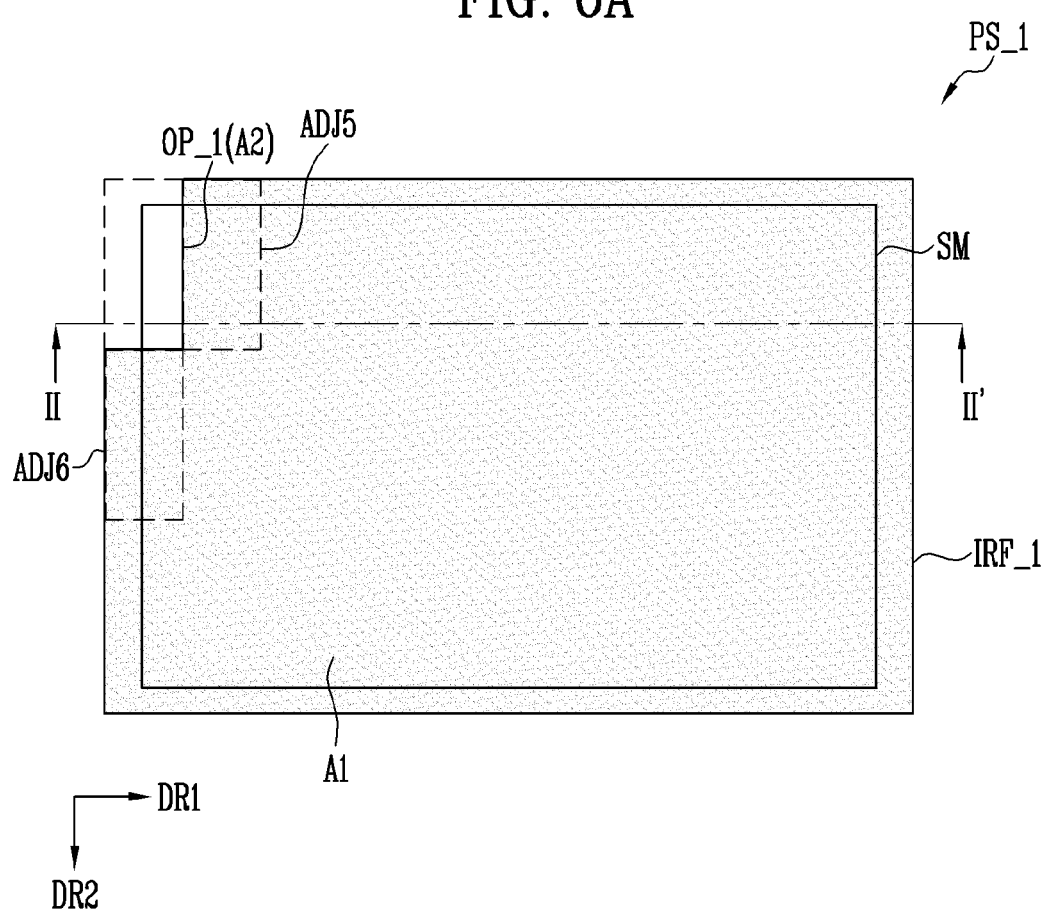
FIG. 6A illustrates an embodiment of the photo sensor in the display device of FIG. 1A, and FIGS. 6B and 6C illustrate embodiments of the photo sensor taken along line II-II' in FIG. 6A.
Figure 6B:
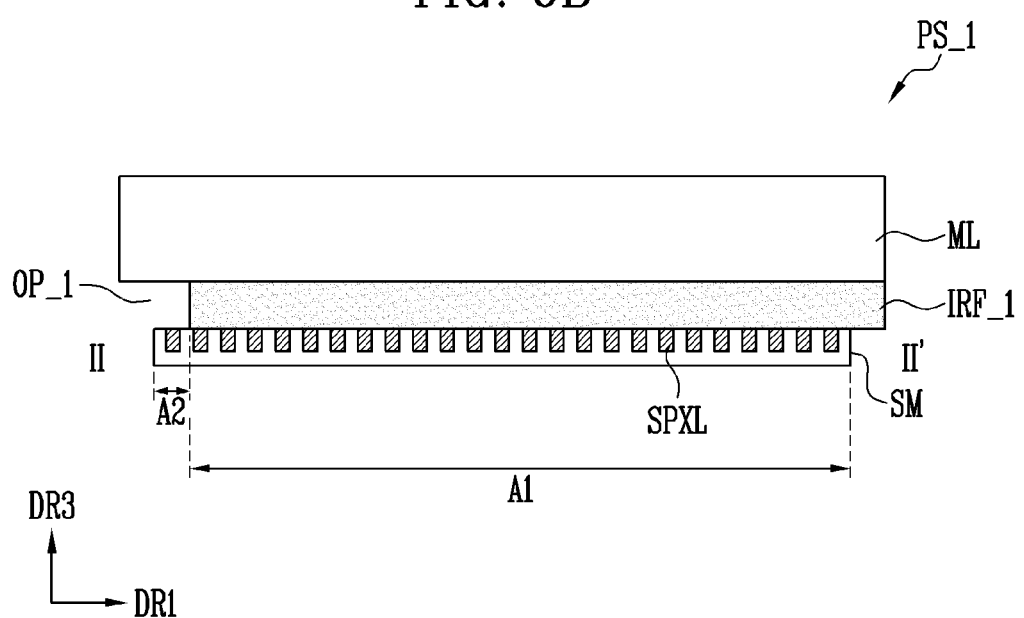
Figure 6C:
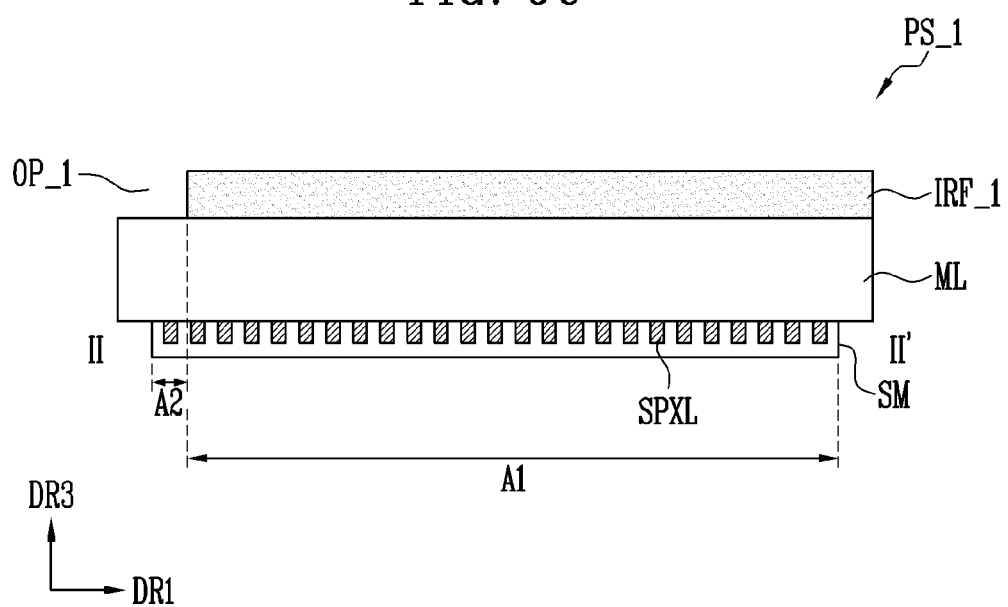

FIG. 6A is a plan view illustrating an embodiment of the photo sensor in the display device shown in FIG. 1A, e.g., FIG. 6A illustrates an example of a photo sensor PS_1 provided in the fingerprint sensing area FSA of the display device 1000 shown in FIGS. 1A and 1B. FIGS. 6B and 6C are sectional views illustrating embodiments of the photo sensor taken along line II-II' shown in FIG. 6A.

Referring to FIGS. 1A, 4A, 4B and 6A to 6C, the photo sensor PS_1 shown in FIGS. 6A to 6C is substantially the same or similar to the photo sensor PS shown in FIGS. 4A and 4B, except for the position of a second area A2 or opening OP_1.

The sensor module SM may include a first area A1 and a second area A2 on a plane, and the second area A2 may be located at one side of the first area A1. As shown in FIG. 6A, the second area A2 may be located at an edge of the first area A1 or a corner of the first area A1.

When the size of the photo sensor PS_1 on a plane is relatively small (e.g., when the photo sensor PS_1 is smaller than a size of 1 cm*1 cm), the second area A2 may be located adjacent to an edge of the first area A1 (or the fingerprint sensing area FSA (e.g., see FIG. 1A)) to prevent the accuracy of fingerprint authentication (performed based on the first sensing signal corresponding to first area A1) from being deteriorated.

The opening OP_1 corresponding to the second area may be formed in a first optical filter IRF_1. In some embodiments, the opening OP_1 may be formed larger than the second area A2. The opening OP_1 may protrude in the first direction DR1 and the second direction DR2 from an edge of the sensor module SM. The opening OP_1 may be formed to further protrude outwardly or to become larger than the second area A2, so that a portion of the sensor module SM corresponding to first area A1 can sufficiently receive light having a long wavelength. For example, as shown in FIG. 6A, when the opening OP_1 is located at a corner of the first optical filter IRF_1, light having a long wavelength can be more sufficiently incident to the first area A1 of the sensor module SM compared with when the opening OP_1 is located in the middle of one surface of the first optical filter IRF_1. Thus, the ratio of the light having the long wavelength may be more accurately calculated, a color of a detected fingerprint may be more accurately estimated, and fake fingerprint determination can be more accurately performed based on the calculated ratio of the light having the long wavelength and the estimated color of the detected fingerprint.

In an embodiment, as shown in FIG. 6B, the first optical filter IRF_1 may be disposed on the sensor module SM and may be disposed on the bottom of the optical lens ML. In one embodiment, as shown in FIG. 6C, the first optical filter IRF_1 may be disposed on the optical lens ML. In one embodiment, the optical sensor PS_1 may further include the second optical filter IRPF as described with reference to FIGS. 5B and 5C. Embodiments including fifth and sixth adjacent areas ADJ5 and ADJ6 are described with reference to FIGS. 8A and 8B.

Although a case where only one opening OP_1 is formed in the first optical filter IRF_1 is illustrated in FIGS. 6A and 6B, this is merely illustrative and the first optical filter IRF_1 is not limited thereto. For example, a plurality of openings OP_1 may be formed corresponding to corners of the first optical filter IRF_1 in one or more other embodiments.

Figure 7B:
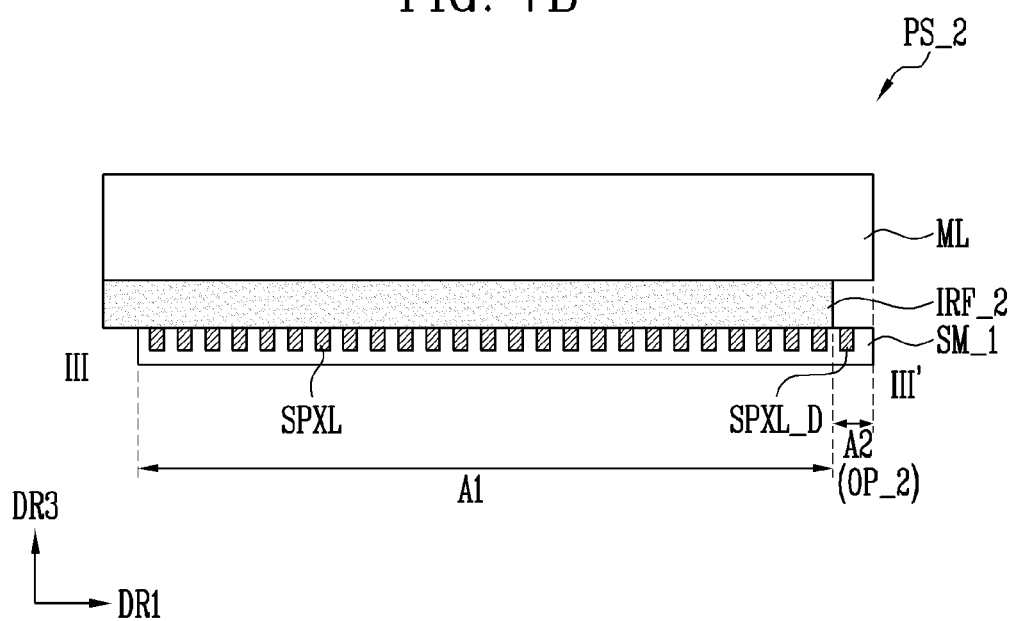
FIG. 7A illustrates an embodiment of the photo sensor in the display device of FIG. 1A, and FIGS. 7B and 7C illustrate embodiments of sectional views of the photo sensor taken along line III-III' in FIG. 7A.
Figure 7C:
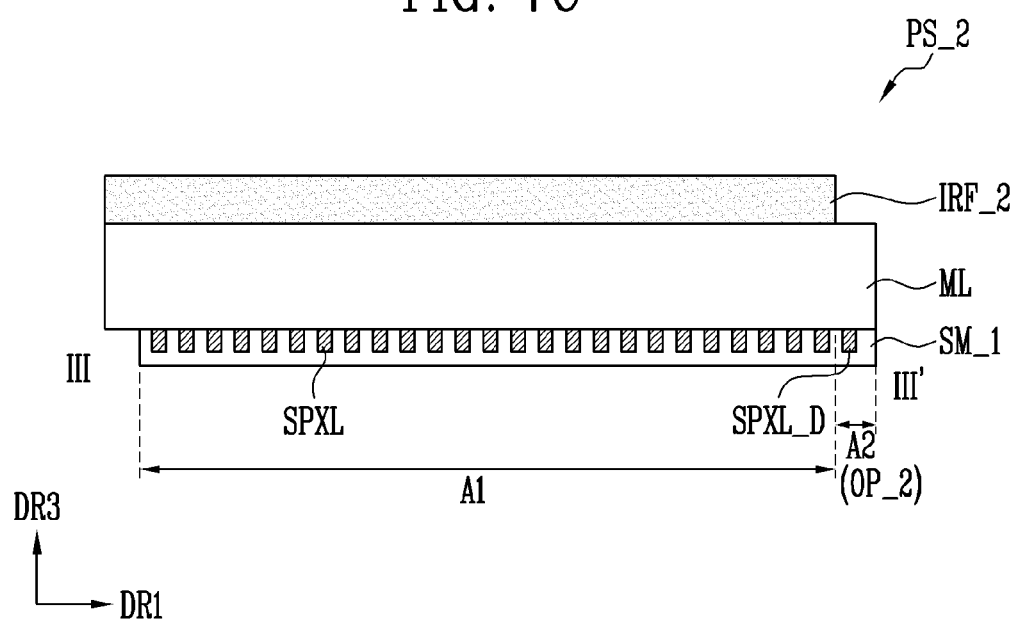

FIG. 7A is a plan view illustrating an embodiment of the photo sensor in the display device shown in FIG. 1A, e.g., FIG. 7A illustrates an example of the optical sensor PS_1 provided in the fingerprint sensing area FSA of the display device 1000 shown in FIGS. 1A and 1B. FIGS. 7B and 7C are sectional views illustrating embodiments of the photo sensor taken along line shown in FIG. 7A.

Referring to FIGS. 1A, 4A, 4B, and 7A to 7C, a photo sensor PS_1 shown in FIGS. 7A to 7C is substantially the same or similar to the photo sensor PS shown in FIGS. 4A and 4B, except for the position of a sensor module SM_1 and a second area A2 (or opening OP_2).

The sensor module SM_1 may include a first area A1 and a second area A2, and the second area A2 may be located at one side of the first area A1. As shown in FIG. 7A, the second area A2 may be located at one side of the first area A1. The sensor module SM_1 may include a sensor pixel SPXL provided in the first area A1 and a dummy sensor pixel SPXL_D provided in the second area A2.

The dummy sensor pixel SPXL_D may be a sensor pixel which does not contribute to fingerprint image generation when a fingerprint image of a detected fingerprint is generated. For example, when a fingerprint image is expressed in a lattice pattern by the pin hole PIH described with reference to FIG. 2B (or when a lattice image is generated by locally reversing a read image with respect to the pin hole PIH), the dummy sensor pixel SPXL_D may not properly contribute to one lattice. In addition, the dummy sensor pixel SPXL_D may be disposed at an outermost portion of the sensor module SM according to various causes or purposes. An area in which the dummy sensor pixel SPXL_D is disposed may be defined as the second area A2.

The opening OP_2 corresponding to the second area A2 may be formed in a first optical filter IRF_2. By the opening OP_2, the sensor module SM may further protrude in the first direction DR1 than the first optical filter IRF_2 on a plane, and the dummy sensor pixel SPXL_D may be exposed by the second opening OP_2. The optical lens ML may be disposed to overlap with the second area A2, so as to condense light toward the dummy sensor pixel SPXL_D.

In the case of the photo sensor PS shown in FIG. 4A, some of the sensor pixels SPXL (instead of the dummy sensor pixel SPXL_D) may sense light having a long wavelength. Therefore, in a worst case (e.g., a case where one feature point of a detected fingerprint corresponds to the opening OP shown in FIG. 4A), the one feature point may not be detected. The accuracy of fingerprint authentication may be slightly lowered. On the other hand, in the case of the optical sensor PS_2 shown in FIG. 7A, the dummy sensor pixel SPXL_D does not substantially contribute to fingerprint image generation and senses light having a long wavelength. Therefore, the accuracy of fingerprint authentication may not be adversely affected.

In an embodiment, as shown in FIG. 7B, the first optical filter IRF_2 may be disposed on the sensor module SM_1 and may be disposed on the bottom of the optical lens ML. In ONE embodiment, as shown in FIG. 7C, the first optical filter IRF_2 may be disposed on the optical lens ML. In one embodiment, the optical sensor PS_2 may further include the second optical filter IRPF as described with reference to FIGS. 5B and 5C. An embodiment including a seventh adjacent area ADJ7 is described with reference to FIGS. 8A and 8B.

Figure 8B:
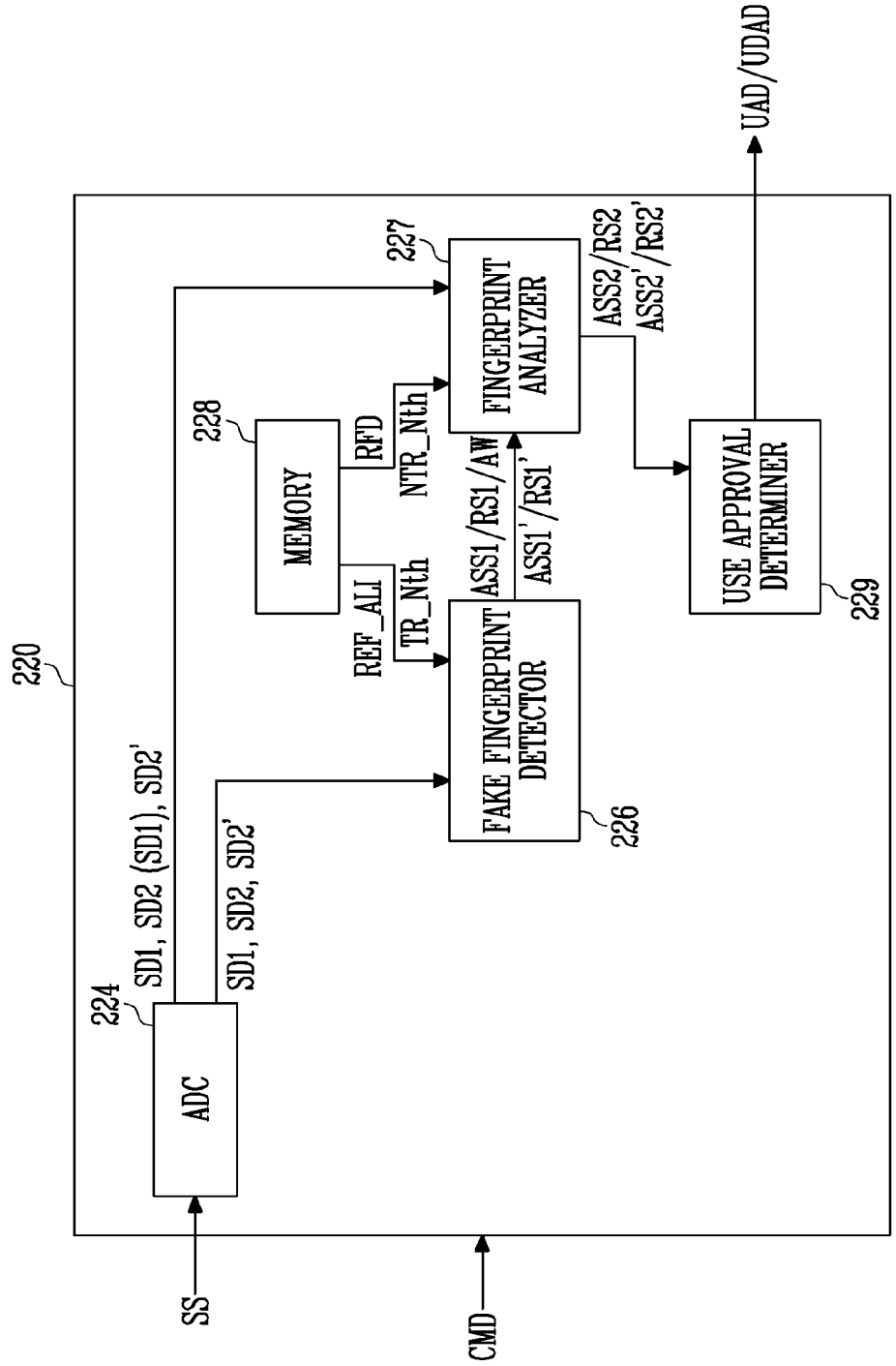

FIGS. 8A and 8B are block diagrams illustrating an embodiment of a fingerprint detector in the display device shown in FIG. 1A. FIG. 9 is a diagram showing an example of a lookup table illustrating values corresponding to a reference range used in the fingerprint detector shown in FIGS. 8A and 8B.

Referring to FIGS. 1A, 1B, 8A, and 8B, the fingerprint detector 220 may include a fake fingerprint detector 226 and a fingerprint analyzer 227. In an embodiment, the fingerprint detector 220 may further include a memory 228 and a use approval determiner 229. The fingerprint detector 220 may perform fingerprint authentication and/or fake fingerprint determination in response to a fingerprint sensing command CMD provided from an external source.

In an embodiment, the fingerprint detector 220 may further include an analog-digital converter (ADC) 224 described with reference to FIG. 3A. The ADC 224 may convert a sensing signal SS in an analog form to sensing data SD1, SD2, and SD2' in a digital form. For example, the ADC 224 may convert a first sensing signal corresponding to the first area A1 to first sensing data SD1, and may convert a second sensing signal corresponding to the second area A2 in contact with the finger FP into second sensing data SD2. Also, the ADC 224 may convert a second sensing signal corresponding to the second area not in contact with the finger FP to second' sensing data SD2'.

The fake fingerprint detector 226 may receive the first sensing data SD1, the second sensing data SD2, and the second' sensing data SD2'. Also, the fake fingerprint detector 226 may receive, from the memory 228, a reference range REF_ALI with respect to a ratio of light having a long wavelength and a reference transmission rate TR_Nth with respect to a transmission rate of the light having the long wavelength. The light having the long wavelength may correspond, for example, to the range or values previously described.

FIG. 9 is a diagram showing an example of a lookup table including values corresponding to a reference range that may be used in the fingerprint detector embodiment(s) of FIGS. 8A and 8B.

Referring to FIG. 9, the lookup table LUT may include values corresponding to a light intensity of red light, a light intensity of green light, a light intensity of blue light, and a ratio values of the red light for each color of a target object. When the light emitting element layer LDL described with reference to FIG. 4C includes a red pixel, a green pixel and a blue pixel, the light intensity of the red light may represent a light intensity of light emitted from the red pixel and then reflected by the target object, the light intensity of the green light may represent a light intensity of light emitted from the green pixel and then reflected by the target object, and the light intensity of the blue light may represent a light intensity of light emitted from the blue pixel and then reflected by the target object. In one embodiment, the ratio of the red light may be a ratio of the light intensity of the red light to a total light intensity of the green light and the blue light.

When the first optical filter IRF described with reference to FIG. 4A and the like blocks light having a long wavelength (e.g., of about 600 nm or more), the total light intensity of the green light and blue light may correspond to the light intensity of the third light L3 (e.g., see FIG. 4C) sensed in the sensor pixel SPXL in the first area A1. Also, the light intensity of the red light may correspond to a result obtained by performing a difference operation on the light intensity of the third light L3 from the light intensity of the second light L2 (e.g., see FIG. 4C) sensed in the sensor pixel SPXL in the second area A2.

Thus, the ratio of the red light may represent a ratio of light having a long wavelength. The ratio of the light having the long wavelength may be defined as a ratio of a light intensity of light having the long wavelength (e.g., light having a wavelength of about 600 nm or more) to a total light intensity of light having a relatively shorter wavelength (e.g., light having a wavelength of about 600 nm or less) except the light having the long wavelength.

As shown in FIG. 9, the ratio of the light having the long wavelength may be about 0.766667 in the case of dark skin, and the ratio of the light having the long wavelength may be about 0.692857 in the case of light skin. Thus, in this example case, the ratio of light having the long wavelength with respect to a real fingerprint may be in a range of about 0.6 to about 0.8. The reference range REF_ALI with respect to the ratio of the light having the long wavelength may be set to about 0.6 to about 0.8. The reference range REF_ALI may have a lower limit value of about 0.6 and may have an upper limit value of about 0.8.

Ratios of the light having the long wavelength with respect to blue, green, white, and black are respectively 0.2654, 0.31674, 0.50103, and 0.5, and may correspond to a range less than about 0.6. A target object having colors of the blue, green, white, and black, with respect to which the ratios of the light having the long wavelength are less than the lower limit value (e.g., 0.6) of the reference range, may be detected or determined as a fake fingerprint. In addition, ratios of light having the long wavelength with respect to red and yellow are respectively 1.535088 and 1.004348, and may correspond to a range greater than about 1.0. A target object having colors of the red and yellow, with respect to which the ratios of the light having the long wavelength are greater than the upper limit value (e.g., 0.8) of the reference range, may be detected or determined as a fake fingerprint.

The lookup table LUT shown in FIG. 9 may be generated in a condition in which the external light L_IR described with reference to FIG. 4C does not exist. Therefore, when the external light L_IR exists, noise caused by the external light L_IR may be increased, and the ratio of the light having the long wavelength may be entirely increased. For example, the ratio of the light having the long wavelength may be increased by about 0.1 to about 0.2 based on the intensity of the external light L_IR. Accordingly, the reference range REF_ALI with respect to the ratio of light having the long wavelength may be set to about 0.7 to about 1.0. That is, the reference range REF_ALI may be changed based on the intensity of the external light L_IR.

Therefore, in some embodiments, a plurality of lookup table LUT may be set for respective intensities of the external light L_IR1. A specific lookup table LUT may be selected corresponding to an intensity of the external light L_IR sensed through an external illuminance sensor (or infrared sensor), and a reference range REF_ALI may be set based on the selected lookup table LUT. The set reference range REF_ALI may be provided from the memory 228 to the fake fingerprint detector 226. However, the present disclosure is not limited thereto.

For example, the fake fingerprint detector 226 may receive a predetermined reference range REF_ALI and may change the reference range REF_ALI based on information on an intensity of the external light L_IR, which is provided from the outside. In one example, the reference range REF_ALI may be set relatively wide, including a margin corresponding to the external light L_IR, or only a lower limit value of the reference range REF_ALI may be set. The ratio of light having the long wavelength with respect to each of other colors which are not described is illustrated in FIG. 9.

In an embodiment, the reference range REF_ALI may be stored for each user when the display device 1000 is initially set. In one embodiment, the reference range REF_ALI may be stored in the memory 228 through analysis of sensing data SD1 and SD2 relating to a detected fingerprint when a fingerprint of the user is registered.

In addition, the reference transmission rate TR_Nth may be stored for each user when the display device 1000 is initially set. In one embodiment, the reference transmission rate TR_Nth may be stored in the memory 228 through analysis of sensing data SD2 and SD2' about a detected fingerprint when the fingerprint of the user is registered.

The fake fingerprint detector 226 may calculate a ratio of light having the long wavelength based on the first sensing data SD1 and the second sensing data SD2. Also, the fake fingerprint detector 226 may calculate a transmission rate of the light having the long wavelength based on the second sensing data SD2 and the second' sensing data SD2'.

In some embodiments, the fake fingerprint detector 226 may calculate the ratio of the light having the long wavelength by comparing the second sensing data SD2 with a portion of the first sensing data SD1 adjacent to the second sensing data SD2. An example is described with reference to FIG. 4A.

The fake fingerprint detector 226 may compare second sensing data SD2 (e.g., light intensity in the second area A2) corresponding to the second area A2 with a portion of first sensing data SD1 (e.g., light intensity in at least one of the first to fourth adjacent areas ADJ1 to ADJ4) corresponding to at least one of the first to fourth adjacent areas ADJ1 to ADJ4 adjacent to the second area A2. Each of the first to fourth adjacent areas ADJ1 to ADJ4 may have substantially the same size as the second area A2 and may be adjacent to the second area A2 respectively in horizontal and vertical directions. For example, the fake fingerprint detector 226 may extract a portion of the first sensing data SD1 (or an average thereof) corresponding to the other adjacent areas except an adjacent area having a largest light intensity and an adjacent area having a smallest light intensity, among light intensities respectively corresponding to the first to fourth adjacent areas ADJ1 to ADJ4. The fake fingerprint detector 226 may then compare the second sensing data SD2 with the extracted portion of the first sensing data SD1. An example is described with reference to FIG. 6A.

The fake fingerprint detector 226 may compare second sensing data SD2 (e.g., light intensity in the second area A2) corresponding to the second area A2 with a portion of first sensing data SD1 (e.g., a light intensity in at least one of the fifth and sixth adjacent areas ADJ5 and ADJ6) corresponding to at least one of the fifth and sixth adjacent areas ADJ5 and ADJ6 adjacent to the second area A2. Each of the fifth and sixth adjacent areas ADJ5 and ADJ6 may have substantially the same size as the second area A2, and may be adjacent to the second area A2 respectively in horizontal and vertical directions. For example, the fake fingerprint detector 226 may compare a portion of first sensing data SD1 corresponding to the fifth adjacent area ADJ5 or the sixth adjacent area ADJ6 with the second sensing data SD2, or may compare an average of a portion of first sensing data SD1 corresponding to the fifth adjacent area ADJ5 and the sixth adjacent area ADJ6 with the second sensing data SD2. An example is described with reference to FIG. 7A.

The fake fingerprint detector 226 may compare second sensing data SD2 (e.g., light intensity in the second area A2) corresponding to the second area A2 with a portion of the first sensing data SD1 (e.g., a light source in the seventh adjacent areas ADJ7) corresponding to the seventh adjacent area ADJ7 adjacent to the second area A2. The seventh adjacent area ADJ7 may have substantially the same size as the second area A2, and may be one most adjacent to the second area A2.

In an embodiment, when the photo sensor PS does not include the second optical filter IRPF (e.g., see FIG. 5B), the fake fingerprint detector 226 may calculate the light intensity of light having the long wavelength by performing a difference operation on the second sensing data SD2 (or a light intensity according to the second sensing data SD2) and a portion of the first sensing data SD1 (or a light intensity according to the portion of the first sensing data SD1). The fake fingerprint detector 226 may then calculate the ratio of light having the long wavelength by performing a division operation (e.g., dividing) on the light intensity of the light having the long wavelength based on a portion of the first sensing data SD1 (or an average light intensity according to the first sensing data SD1.

In one embodiment, when the photo sensor PS includes the second optical filter IRPF (e.g., see FIG. 5B) overlapping with the second area A2, the fake fingerprint detector 226 may calculate a ratio of light having the long wavelength by performing a division operation on the second sensing data SD2 (or a light intensity according to the second sensing data SD2) based on a portion of the first sensing data SD1 (or a light intensity according to the portion of the first sensing data SD1).

In some embodiments, the fake fingerprint detector 226 may calculate the transmission rate of light having the long wavelength by comparing the second sensing data SD2 with the second' sensing data SD2'. An example is described with reference to FIGS. 4A and 4C.

The fake fingerprint detector 226 may compare second sensing data SD2 corresponding to the second area A2 in contact with the finger FP (e.g., light intensity in the second area A2 in contact with the finger FP) with second' sensing data SD2' corresponding to the second area A2 not in contact with the finger FP (e.g., light intensity in the second area A2 not in contact with the finger FP).

For example, the fake fingerprint detector 226 may compare second' sensing data SD2', corresponding to the light intensity of light having a long wavelength (which has a smallest light intensity among light intensities of the light having the long wavelength) sensed in the second area A2 not in contact with the finger FP, with second sensing data SD2 corresponding to the second area A2 in contact with the finger FP. The fake fingerprint detector 226 may then calculate the transmission rate of light having the long wavelength based on the comparison result.

The transmission rate of light having the long wavelength as calculated by the fake fingerprint detector 226 may be determined, for example, based on Equation 1.

$$TR_i \text{(Transmission Rate)} = \frac{SD2'MN}{\left[\frac{1}{N-1} \cdot \left(\sum_{i=0}^{N-1} SD2_i - SD2'MN\right)\right]} \quad (1)$$

An example is described with reference to FIG. 6A.

The fake fingerprint detector 226 may compare second sensing data SD2 corresponding to the second area A2 in contact with the finger FP (e.g., light intensity in the second area A2 in contact with the finger FP) with second' sensing data SD2' corresponding to the second area A2 not in contact with the finger FP (e.g., light intensity in the second area A2 not in contact with the finger FP). Both the second area A2 in contact with the finger FP and the second area A2 not in contact with the finger FP exist in a second area A2 corresponding to the opening OP_1.

For example, the fake fingerprint detector 226 may compare second' sensing data SD2' corresponding to the light intensity of the light having the long wavelength (which has a smallest light intensity among light intensities of the light having the long wavelength) sensed in the second area A2 corresponding to the opening OP_1 not in contact with the finger FP, with second sensing data SD2 corresponding to the second area A2 corresponding to the opening OP_1 in contact with the finger FP. The fake fingerprint detector 26 may then calculate a transmission rate of the light having the long wavelength based on the comparison result. An embodiment is described with reference to FIG. 7A.

The fake fingerprint detector 226 may compare second sensing data SD2 corresponding to the second area A2 in contact with the finger FP (e.g., light intensity in the second area A2 in contact with the finger FP) with second' sensing data SD2' corresponding to the second area A2 not in contact with the finger FP (e.g., light intensity in the second area A2 not in contact with the finger FP). Both the second area A2 in contact with the finger FP and the second area A2 not in contact with the finger FP exist in a second area A2 corresponding to the opening OP_2.

In one embodiment, the fake fingerprint detector 226 may compare second' sensing data SD2' corresponding to the light intensity of light having the long wavelength (which has a smallest light intensity among light intensities of the light having the long wavelength) sensed in the second area A2 corresponding to the opening OP_2 not in contact with the finger FP, with second sensing data SD2 corresponding to the second area A2 corresponding to the opening OP_2 in contact with the finger FP. The fake fingerprint detector 226 may then calculate a transmission rate of the light having the long wavelength based on the comparison result.

The fake fingerprint detector 226 may determine whether a detected fingerprint is a fake fingerprint by comparing the rate of the light having the long wavelength with the reference range REF_ALI. The fake fingerprint detector 226 may also determine whether the detected fingerprint is a fake fingerprint by comparing the calculated transmission rate of the light having the long wavelength with the reference transmission rate TR_Nth.

Hereinafter, a method in which the fake fingerprint detector 226 determines whether the detected fingerprint is a fake fingerprint (by comparing the ratio of the light having the long wavelength with the reference range REF_ALI) will be described.

When the ratio of light having the long wavelength is within the reference range REF_ALI, the fake fingerprint detector 226 may determine that the detected fingerprint is a real fingerprint. On the other hand, when the ratio of light having the long wavelength is out of the reference range REF_ALI, the fake fingerprint detector 226 may determine that the detected fingerprint is a fake fingerprint.

When it is determined that the detected fingerprint is the real fingerprint, the fake fingerprint detector 226 may output a first approval signal ASS1. On the contrary, when it is determined that the detected fingerprint is a fake fingerprint, the fake fingerprint detector 226 may output a first refusal signal RS1. The first approval signal ASS1 or the first refusal signal RS1 may be provided to the use approval determiner 229.

In an embodiment, the fake fingerprint detector 226 may generate an approval weight AW based on the ratio of light having the long wavelength with respect to the detected fingerprint and the reference range REF_ALI. The probability that the detected fingerprint will be the real fingerprint becomes higher as the ratio of light having the long wavelength approaches a range (e.g., a range of about 0.69 to about 0.77) corresponding to dark skin or light skin. For example, the approval weight AW may increase as the ratio of light having the long wavelength becomes closer to the range corresponding to dark skin or light skin.

The fingerprint analyzer 227 may receive the first sensing data SD1 and the second sensing data SD2 or may receive the first sensing data SD1. Also, the fingerprint analyzer 227 may receive registered fingerprint data RFD from the memory 228. In an embodiment, the fingerprint analyzer 227 may perform fingerprint authentication by comparing the first and second sensing data SD1 and SD2 with the registered fingerprint data RFD. In one embodiment, the fingerprint analyzer 227 may perform fingerprint authentication by comparing the first sensing data SD1 with the registered fingerprint data RFD. For example, as described with reference to FIG. 7A, when the second sensing data SD2 corresponds to the dummy sensor pixel SPXL_D, the fingerprint analyzer 227 may perform fingerprint authentication by comparing the first sensing data SD1 with the registered fingerprint data RFD.

The fingerprint analyzer 227 may calculate an accordance rate between the first and second sensing data SD1 and SD2 (or the first sensing data SD1) and the registered fingerprint data RFD. In an embodiment, the fingerprint analyzer 227 may generate a fingerprint image corresponding to the first and second sensing data SD1 and SD2 (or the first sensing data SD1) through image processing, and perform fingerprint authentication by comparing the generated fingerprint image with a fingerprint image (e.g., a registered fingerprint image) of the registered fingerprint data RFD. However, this is merely illustrative, and the method for performing fingerprint authentication may be implemented using various other fingerprint recognition methods. The fingerprint analyzer 227 may include a hardware configuration and/or a software configuration used for fingerprint authentication.

When the accordance rate is a predetermined threshold value or more, the fingerprint analyzer 227 may determine that the detected fingerprint accords with the registered fingerprint data RFD. When the accordance rate is less than the threshold value, the fingerprint analysis 227 may determine that the detected fingerprint does not accord with the registered fingerprint data RFD.

When it is determined that the detected fingerprint accords with the registered fingerprint data RFD, the fingerprint analyzer 227 may output a second approval signal ASS2. On the contrary, when it is determined that the detected fingerprint does not accord with the registered fingerprint data RFD, the fingerprint analyzer 227 may output a second refusal signal RS2. The second approval signal ASS2 or the second refusal signal RS2 may be provided to the use approval determiner 229.

Hereinafter, a method in which the fake fingerprint detector 226 determines whether the detected fingerprint is a fake fingerprint (by comparing the calculated transmission rate TRi of the light having the long wavelength with the reference transmission rate TR_Nth) will be described.

When the transmission rate TRi of the light having the long wavelength is the reference transmission rate TR_Nth or more, the fake fingerprint detector 226 may determine that the detected fingerprint is the real fingerprint. On the other hand, when the transmission rate TRi of the light having the long wavelength is less than the reference transmission rate TR_Nth, the fake fingerprint detector 226 may determine that the detected fingerprint is a fake fingerprint.

When it is determined that the detected fingerprint is the real fingerprint, the fake fingerprint detector 226 may output a first' approval signal ASS1'. On the contrary, when it is determined that the detected fingerprint is the fake fingerprint, the fake fingerprint detector 226 may output a first' refusal signal RS1'. The first' approval signal ASS1' or the first' refusal signal RS1' may be provided to the use approval determiner 229.

The fingerprint analyzer 227 may receive the second sensing data SD2 and the second' sensing data SD2'. Also, the fingerprint analyzer 227 may receive a registered registration transmission rate NTR_Nth from the memory 228. Also, the fingerprint analyzer 227 may calculate a transmission rate of the light having the long wavelength based on the received second sensing data SD2 and the received second' sensing data SD2'. Also, the fingerprint analyzer 227 may perform fingerprint authentication by comparing the calculated transmission rate of the light having the long wavelength with the registered registration transmission rate NTR_Nth. In one embodiment, the fingerprint analyzer 227 may calculate an accordance rate between the transmission rate of light having the long wavelength and the registered registration transmission rate NTR_Nth.

When the accordance rate is a predetermined threshold value or more, the fingerprint analyzer 227 may determine that a light transmission rate of the detected fingerprint accords with the registered registration transmission rate NTR_Nth. Also, when the accordance rate is less than the threshold value, the fingerprint analyzer 227 may determine that the light transmission rate of the detected fingerprint does not accord with the registered registration transmission rate NTR_Nth.

When it is determined that the light transmission rate of the detected fingerprint accords with the registered registration transmission rate NTR_Nth, the fingerprint analyzer 227 may output a second' approval signal ASS2'. On the contrary, when it is determined that the light transmission rate of the detected fingerprint does not accord with the registered registration transmission rate NTR_Nth, the fingerprint analyzer 227 may output a second' refusal signal RS2'. The second' approval signal ASS2' or the second' refusal signal RS2' may be provided to the use approval determiner 229.

The use approval determiner 229 may determine a use approval signal UAD with respect to the display device 1000, based on the result of fake fingerprint determination and the result of fingerprint authentication.

In an embodiment, when the first approval signal ASS1, the second approval signal ASS2, the first' approval signal ASS1', and the second' approval signal ASS2' are generated, the use approval determiner 229 may output the use approval signal UAD to the panel driver 210 and/or an external processor. Execution of the display device 1000 or a corresponding application may be approved based on the use approval signal UAD.

In an embodiment, when at least one of the first refusal signal RS1, the second refusal signal RS2, the first' refusal signal RS1', or the second' refusal signal RS2' is generated, the use approval determiner 229 may output a use disapproval signal UDAD to the panel driver 210 and/or the external processor. The display device 1000 or the corresponding application may not be executed based on the use disapproval signal UDAD.

In an embodiment, the fake fingerprint detector 226 may generate the approval weight AW instead of the first approval signal ASS1 and the first refusal signal RS1. The use approval determiner 229 receiving the approval weight AW and the second approval signal ASS2 may determine use approval according to the magnitude of the approval weight AW. When the use approval determiner 229 receives the second refusal signal RS2, the use approval determiner 229 may output the use disapproval signal UDAD regardless of the magnitude of the approval weight AW.

A case where the first approval signal ASS1, the first refusal signal RS1, the approval weight AW, the first' approval signal ASS1', and the first' refusal signal RS1' are provided to the use approval determiner 229 is illustrated in FIG. 8A. However, the present disclosure is not limited thereto.

As shown in FIG. 8B, the first approval signal ASS1, the first refusal signal RS1, the approval weight AW, the first' approval signal ASS1', and the first' refusal signal RS1' may be provided to the fingerprint analyzer 227.

The fingerprint analyzer 227 may perform fingerprint authentication based on the first approval signal ASS1, the first refusal signal RS1, the approval weight AW, the first' approval signal ASS1', and the first' refusal signal RS1'. For example, when the fingerprint analyzer 227 receives the first approval signal ASS1 and the first' approval signal ASS1', the fingerprint analyzer 227 may perform fingerprint authentication. In one embodiment, when the fingerprint analyzer 227 receives at least one of the first refusal signal RS1 or the first' refusal signal RS1', the fingerprint analyzer 227 may not perform the fingerprint authentication. In one embodiment, when the fingerprint analyzer 227 receives the approval weight AW, the approval weight AW may be reflected when the accordance rate is calculated.

As described above, the fingerprint detector 220 (e.g., the fingerprint authentication device FDD or the display device 1000) can detect the fake fingerprint by calculating the ratio of the light having the long wavelength based on the first sensing data SD1 corresponding to the first area A1 and the second sensing data SD2 corresponding to the second area A2.

The fingerprint detector 220 (e.g., the fingerprint authentication device FDD or the display device 1000) can detect the fake fingerprint by calculating the ratio of the light having the long wavelength based on the second sensing data SD2 corresponding to the second area A2 in contact with the finger FP and the second' sensing data SD2' corresponding to the second area A2 not in contact with the finger FP.

Accordingly, the accuracy and reliability of fingerprint detection can be improved without increasing manufacturing costs and/or requiring an additional configuration.

Figure 10:
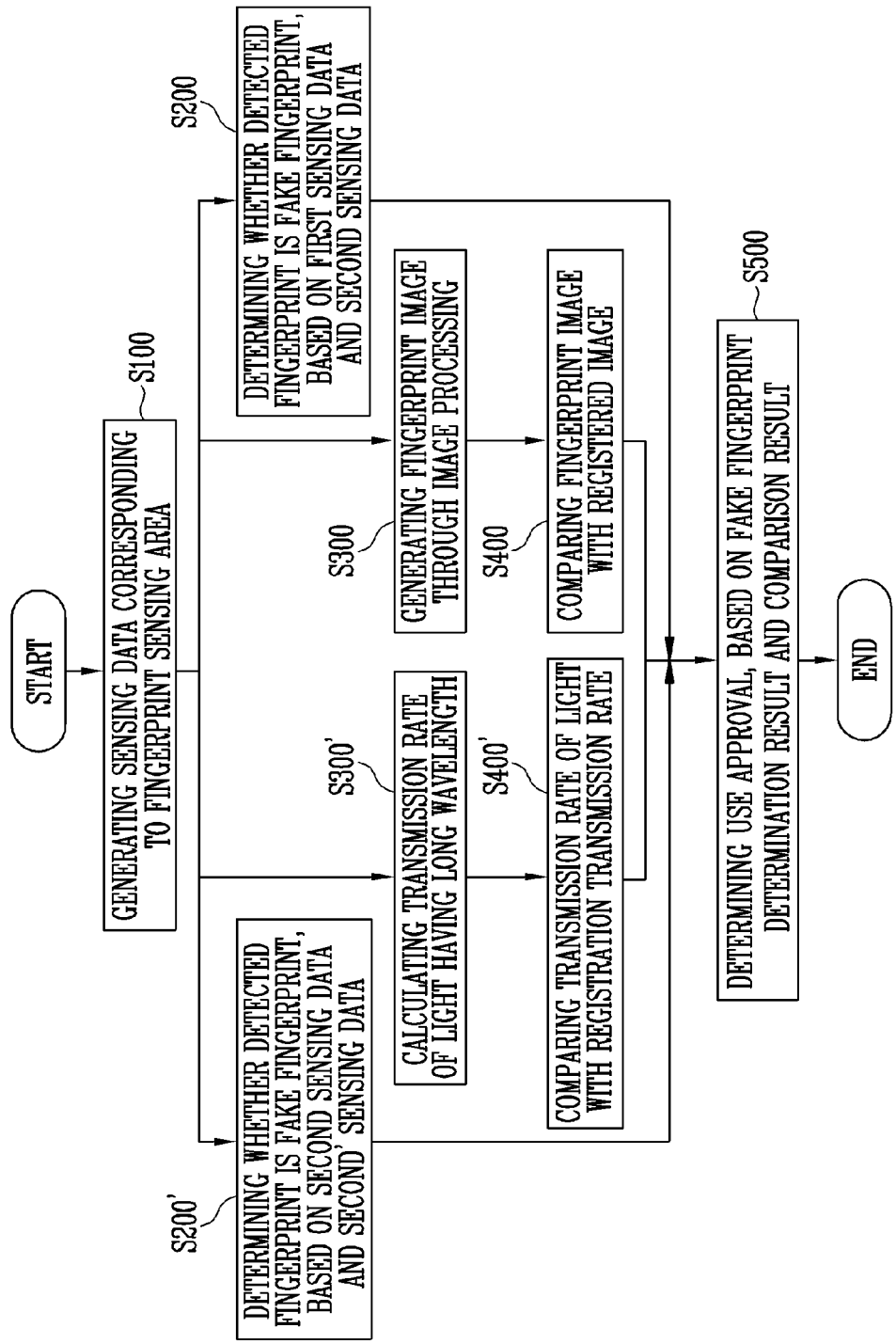
FIG. 10 illustrates an embodiment of a method of authenticating a fingerprint.
Figure 11:
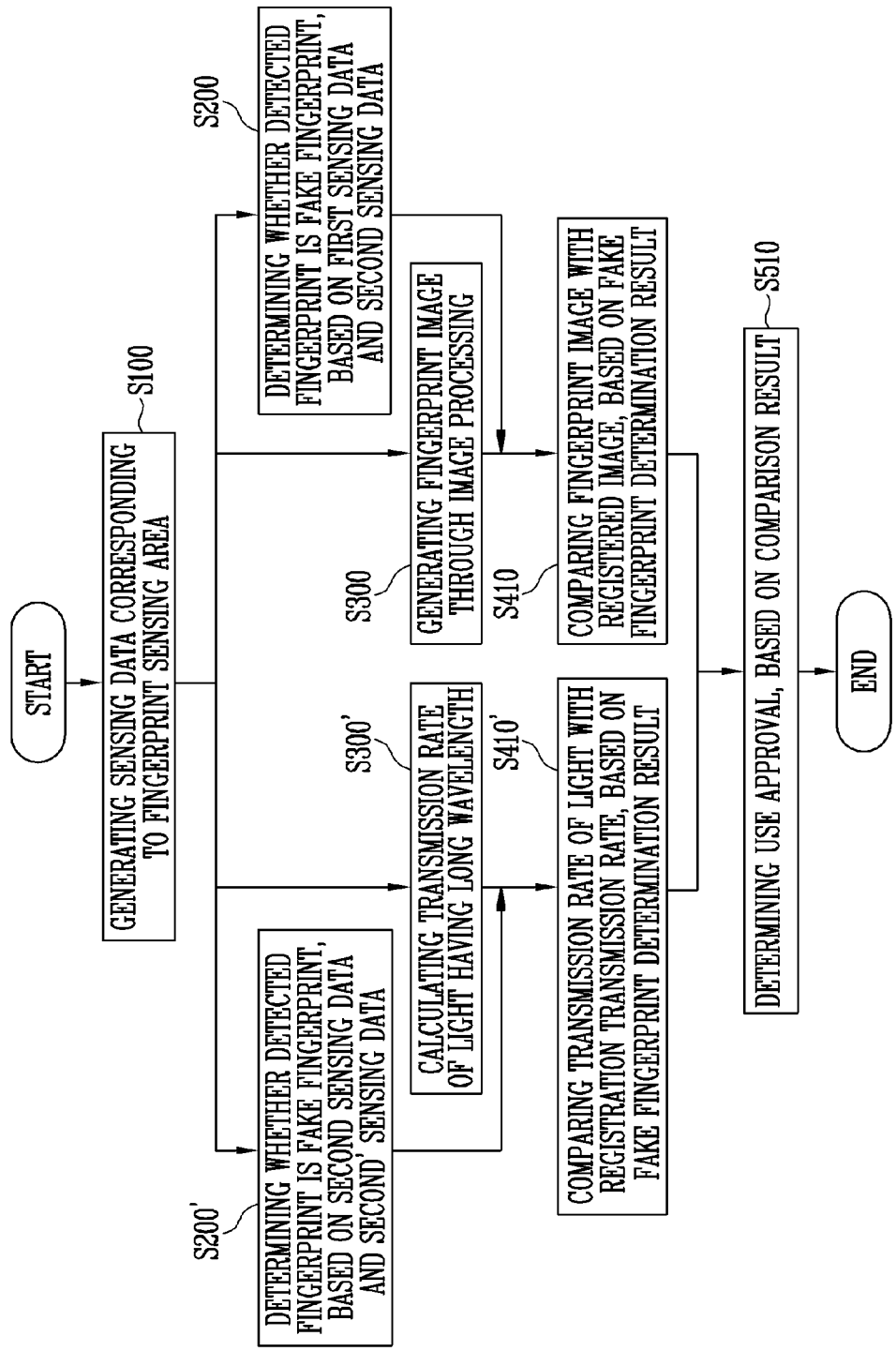
FIG. 11 illustrates an embodiment of a method of authenticating a fingerprint.

FIG. 10 is a flowchart illustrating an embodiment of a method of authenticating a fingerprint, and FIG. 11 is a flowchart illustrating an example of the method of FIG. 10. In FIGS. 10 to 13, like components as described above are designated by like reference numerals. Also, the method may be performed by the display device 1000 (or the fingerprint authentication device FDD) shown in FIG. 1A.

Referring to FIGS. 1A to 10, at S100 of the method, sensing data corresponding to the fingerprint sensing area FSA may be generated using the photo sensor PS.

At S200, whether a detected fingerprint is a fake fingerprint may be determined based on first sensing data corresponding to the first area A1 and second sensing data corresponding to the second area A2 in the sensing data. At S200', whether the detected fingerprint is the fake fingerprint may be determined based on second sensing data corresponding to the second area A2 in contact with the finger FP and second' sensing data SD2' corresponding to the second area A2 not in contact with the finger FP.

At S300, a fingerprint image may be generated through image processing on the sensing data.

At S400, fingerprint authentication may be performed by comparing the fingerprint image with a registered fingerprint image (S400). In addition, at S300', a transmission rate of light having a long wavelength with respect to the sensing data may be calculated, and at S400' fingerprint authentication may be performed by comparing the calculated transmission rate with the registered registration transmission rate NTR_Nth.

At S500, subsequently, use approval may be determined based on a fake fingerprint determination result and a comparison result (or fingerprint authentication result).

In one embodiment of the method, performing fingerprint authentication (S400) may include calculating an accordance rate between the sensing data and registered fingerprint data and comparing the accordance rate with a threshold value. When the accordance rate is less than the threshold value, it may be determined that the detected fingerprint does not accord with the registered fingerprint data. When it is determined that the detected fingerprint does not accord with the registered fingerprint data, use of the display device 1000 or a corresponding application may be disapproved. When the accordance rate is the threshold value or more, it may be determined that the detected fingerprint accords with the registered fingerprint data.

In one embodiment of the method, performing fingerprint authentication (S400') may include determining an accordance rate between the calculated transmission rate of the light having the long wavelength and the registered registration transmission rate NTR_Nth, and comparing the accordance rate with a threshold value. When the accordance rate is less than the threshold value, it may be determined that the light transmission rate of the detected fingerprint does not accord with the registered registration transmission rate NTR_Nth. When it is determined that the light transmission rate of the detected fingerprint does not accord with the registered registration transmission rate NTR_Nth, use of the display device 1000 or the corresponding application may be disapproved.

When the accordance rate is the threshold value or more, it may be determined that the light transmission rate of the detected fingerprint accords with the registered registration transmission rate NTR_Nth. When it is determined that the detected fingerprint accords with the registered fingerprint data, and the light transmission rate of the detected fingerprint accords with the registered registration transmission rate NTR_Nth, use of the display device 1000 or the corresponding application may be approved. For example, when it is determined that the registered fingerprint data accords with the registered fingerprint data, the light transmission rate of the detected fingerprint accords with the registered registration transmission rate NTR_Nth and the detected fingerprint is a real fingerprint, use of the display device 1000 or the corresponding application may be approved.

As described above, in the method embodiment shown in FIG. 10, fake fingerprint detection and fingerprint authentication can be performed in parallel through one-time image acquisition in the fingerprint sensing area FSA. Thus, the time to perform fingerprint detection and use approval can be reduced.

In this method embodiment, use approval is determined based on the fake fingerprint determination result and the comparison result (or fingerprint authentication result) as described with reference to FIG. 8A. However, the present disclosure is not limited thereto and may be determined in other ways as described herein.

Referring to FIGS. 11 and 8B, in one method embodiment, a fingerprint image may be generated through image processing on sensing data (S300), the fingerprint image may be compared with a registered fingerprint image (S410) based on the fake fingerprint determination result (S200), a transmission rate of light having a long wavelength with respect to the sensing data may be calculated (S300'), fingerprint authentication may be performed by comparing the calculated transmission rate with the registered registration transmission rate NTR_Nth (S410') based on the fake fingerprint determination result (S200'), and use approval may be determined based on a comparison result (or fingerprint authentication result).

When it is determined that the detected fingerprint is the real fingerprint, the fingerprint authentication operation (S410) may be performed. When the fingerprint authentication is successfully performed, use of (or access to) the display device 1000 or the corresponding application may be approved. When it is determined that the detected fingerprint is a fake fingerprint, the fingerprint authentication (S410) may be omitted and use of (or access to) the display device 1000 or the corresponding application may be disapproved.

Thus, in the method embodiment of FIG. 11, fingerprint authentication is performed after the operation of determining whether the detected fingerprint is a fake fingerprint. As a result, calculation load in fingerprint detection can be decreased.

Figure 12:
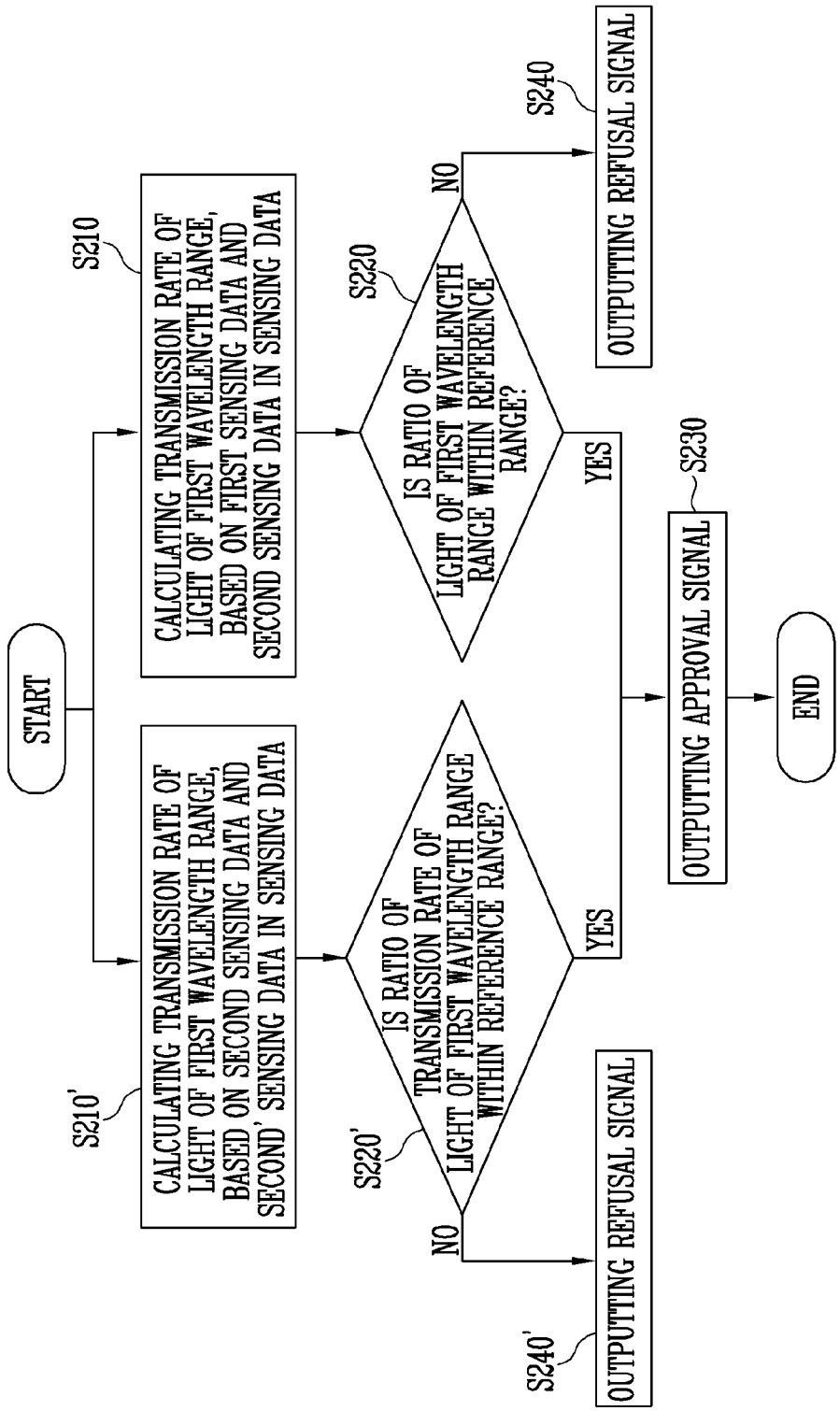
FIG. 12 illustrates an embodiment of a method of authenticating a fingerprint.
Figure 13:
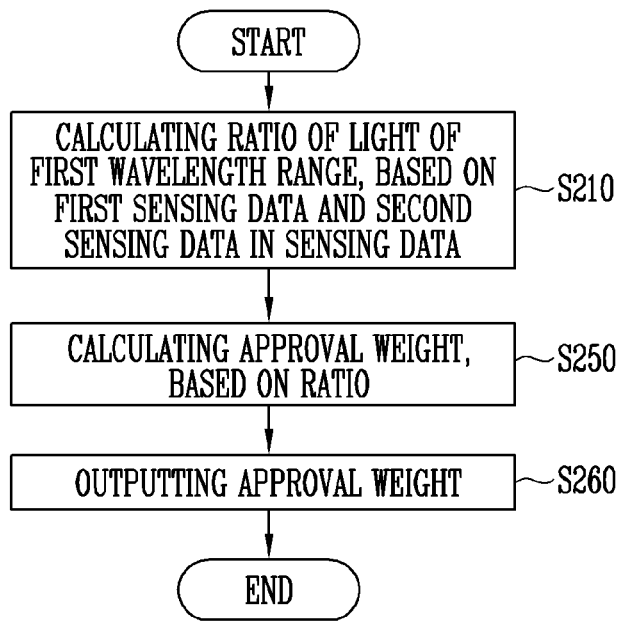
FIG. 13 illustrates an embodiment of a method of authenticating a fingerprint.

A detailed operation of method embodiments including fake fingerprint determination may be performed as shown in FIGS. 12 and 13.

FIG. 12 is a flowchart illustrating an embodiment of the method of FIG. 10. Referring to FIGS. 1A to 12, first, sensing data SD1 and SD2 may be generated based on light sensed from the fingerprint sensing area FSA. The sensing data SD1 and SD2 may include first sensing data SD1 corresponding to the first area A1 in which light of a first wavelength range is blocked and second sensing data SD2 corresponding to the second area in which light of the first wavelength range is transmitted. The light of the first wavelength range may be light having a predetermined (e.g., relatively long) wavelength, e.g., of about 600 nm or more or about 500 nm or more.

The fake fingerprint determination (S200) may include calculating a ratio of light in the first wavelength range based on the first sensing data SD1 and the second sensing data SD2 (S210). In addition, sensing data SD2 and SD2' may be generated based on the light sensed from the fingerprint sensing area FSA. The sensing data SD2 and SD2' may include second sensing data SD2 corresponding to the second area A2 in which the light of the first wavelength range is transmitted through the finger FP. Also, sensing data SD2 and SD2' may include second' sensing data SD2' corresponding to the second area A2 in which light of the first wavelength range is not transmitted through the finger FP.

The fake fingerprint determination (S200') may include calculating a ratio of the transmission rate of the light of the first wavelength range based on the second sensing data SD2 and the second' sensing data SD2' (S210'). Subsequently, it may be determined whether the ratio of light of the first wavelength range is within a reference range (S220).

When the ratio of light of the first wavelength range is out of the reference range, it may be determined that the detected fingerprint is a fake fingerprint. Subsequently, a signal may be output which corresponds to a result obtained by determining whether the detected fingerprint is a fake fingerprint.

In addition, it may be determined whether the ratio of the transmission rate of light of the first wavelength range is within a reference range (S220'). When the ratio of the transmission rate of light of the first wavelength range is out of the reference range, it may be determined that the detected fingerprint is a fake fingerprint.

When it is determined that the detected fingerprint is the real fingerprint, an approval signal (or first approval signal) for approving use of (or access to) the display device 1000 or the corresponding application may be output (S230).

When it is determined that the detected fingerprint is a fake fingerprint, a refusal signal (or first refusal signal) for disapproving use of (or access to) the display device 1000 or the corresponding application may be output (S240 and S240').

FIG. 13 is a flowchart illustrating an embodiment of the method of FIG. 10.

Referring to FIGS. 1A to 11 and 13, the fake fingerprint determination (S300) may include calculating a ratio of light of the first wavelength range based on first sensing data SD1 and second sensing data SD2 (S210), calculating an approval weight by comparing the ratio of light of the first wavelength range with a reference range (S250), and outputting the approval weight (S260).

When the approval weight is a use approval reference or more, use of (or access to) the display device 1000 or the corresponding application may be approved. When the approval weight is less than the use approval reference, use of (or access to) the display device 1000 or the corresponding application may be disapproved.

Figure 14C:
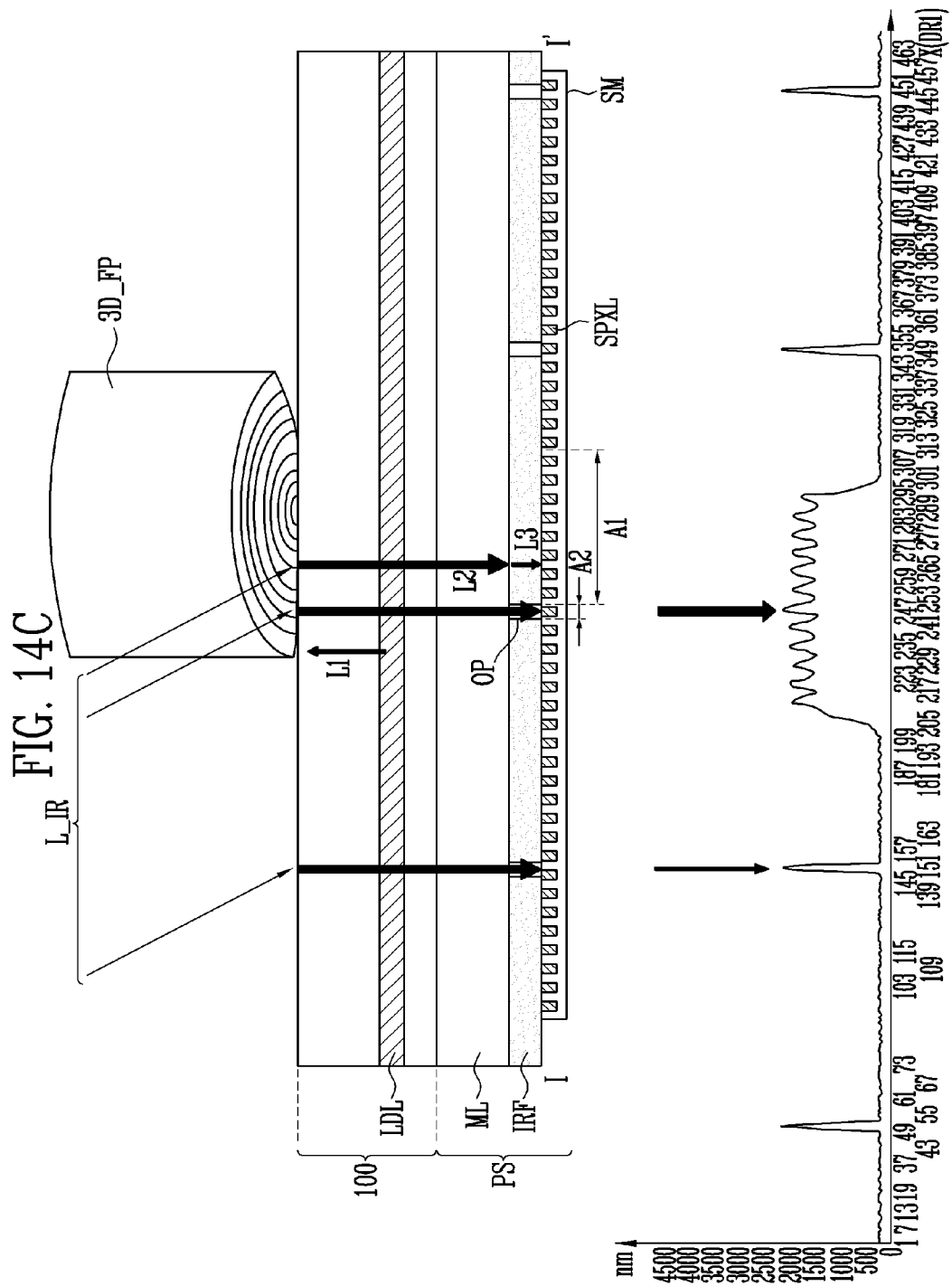
FIG. 14C illustrates an example of a transmission rate of light when a three-dimensional imitation fingerprint contacts a second area.

FIG. 14A is a view illustrating a transmission rate of light having a long wavelength in the second area, when the finger FP of the user is in contact with the second area in accordance with an embodiment. FIG. 14B is a view illustrating a transmission rate of light having a long wavelength in the second area when a two-dimensional imitation fingerprint is in contact with the second area in accordance with an embodiment. FIG. 14C is a view illustrating a transmission rate of light having a long wavelength in the second area when a three-dimensional imitation fingerprint is in contact with the second area in accordance with an embodiment.

Referring to FIG. 14A, at a portion of the sensor module SM located in the second area A2 not in contact with the finger FP of the user, external light L_IR (e.g., red light and infrared light) having a predetermined wavelength is not transmitted through the finger FP of the user from the outside, but may be incident into the display panel 100. The predetermined wavelength may be, for example, a long wavelength of about 600 nm or more or about 500 nm or more.

In addition, a portion of the sensor module SM located in the opening OP (formed in the first optical filter IRF in the second area A2 in contact with the finger FP of the user) may sense second light L2 including light having the long wavelength of about 600 nm or more or about 500 nm or more.

When the opening OP is not formed in the first optical filter IRF in the second area A2 in contact with the finger FP of the user, a portion of the sensor module SM may sense third light L3 not including the light having the long wavelength of about 600 nm or more or about 500 nm or more.

On the other hand, referring to FIGS. 14B and 14C, it can be seen that, when a two-dimensional imitation fingerprint 2D_FP or a three-dimensional imitation fingerprint 3D_FP is in contact with the second area A2, a light intensity of the light having the long wavelength, which is sensed by the sensor module SM located in the second area A2, is different from that shown in FIG. 14A.

In FIG. 14A, the fake fingerprint detector 226 may calculate a transmission rate TRi of light having the long wavelength based on light intensity of light having the long wavelength (which is sensed by the sensor module SM located in the second area A2 not in contact with the finger FP) and light intensity of the light having the long wavelength in the second light L2 sensed by the sensor module SM located in the second area A2 in contact with the finger FP.

As described in FIG. 9, a reference transmission ratio TR_Nth of a user may be stored for each user in the memory 228 when the display device 1000 is initially set. The transmission rate TRi of light having the long wavelength (which is calculated according to contact of the real finger FP instead of the imitation fingerprints 2D_FP and 3D_FP) may be stored as the reference transmission ratio TR_Nth in the memory 228.

Thus, a real finger FP of a user can be distinguished from a two-dimensional imitation fingerprint 2D_FP or three-dimensional imitation fingerprint 3D_FP. This may be accomplished by comparing the transmission rate of light having a predetermined wavelength with a reference transmission rate TR_Nth. The predetermined wavelength may be calculated when the two-dimensional imitation fingerprint 2D_FP or the three-dimensional imitation fingerprint 3D_FP (e.g., shown in FIG. 14B or 14C) is in contact with the display panel 100. The reference transmission rate TR_Nth may be calculated according to contact of the real finger FP of the user and then stored in the memory 228. Accordingly, fingerprint authentication can be performed. The predetermined wavelength may be, for example, the long wavelength as previously described.

In accordance with one or more embodiments, a fake fingerprint can be effectively detected using a fingerprint authentication device, a display device including the same, and a method of authenticating a fingerprint as described herein.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a non-transitory computer-readable medium to store the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, devices, modules, determiners, detectors, analyzers, converters, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, devices, modules, determiners, detectors, analyzers, converters, units, multiplexers, generators, logic, interfaces, decoders, drivers, generators and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, modules, determiners, detectors, analyzers, converters, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present disclosure as set forth in the following claims. The embodiments may be combined to form additional embodiments.

What is claimed is:

1. A display device, comprising:
   a display panel;
   a sensor disposed on the display panel and including a first area and a second area, the sensor configured to sense light transmitted through the display panel;
   an optical filter disposed between the display panel and the sensor, the optical filter overlapping with the first area and not overlapping with the second area, the optical filter configured to block light corresponding to a first wavelength range in a wavelength range of the light; and
   a fingerprint detector configured to determine whether a fingerprint is a fake fingerprint or a pre-registered fingerprint based on a first sensing signal corresponding to an area in contact with a finger in the second area and a second sensing signal corresponding to an area not in contact with the finger among sensing signals from the sensor.

2. The display device of claim 1, further comprising:
   a memory,
   wherein the fingerprint detector is configured to:
   calculate a transmission rate of the light corresponding to the first wavelength range based on a first light intensity of light corresponding to the first wavelength range which corresponds to the first sensing signal, and a second light intensity corresponding to the first wavelength range which corresponds to the second sensing signal;
   determine whether the fingerprint is the fake fingerprint by comparing the transmission rate of the light with a reference transmission rate pre-stored in the memory; and
   determine whether the fingerprint is the pre-registered fingerprint by comparing the transmission rate of the light with a registration transmission rate pre-stored in the memory.

3. The display device of claim 2, further comprising:
   a use approval determiner,
   wherein the fingerprint detector includes a fake fingerprint detector and a fingerprint analyzer, the fake fingerprint detector configured to:
   transmit a first approval signal to the use approval determiner when the transmission rate of the light is the reference transmission rate or more; and transmit a first refusal signal to the use approval determiner when the transmission rate of the light is less than the reference transmission rate.

4. The display device of claim 3, wherein the fingerprint analyzer is configured to:
transmit a second approval signal to the use approval determiner when an accordance rate between the transmission rate of the light and the registration transmission rate is a predetermined threshold value or more; and
transmit a second refusal signal to the use approval determiner when the accordance rate between the transmission rate of the light and the registration transmission rate is less than the predetermined threshold value.

5. The display device of claim 4, wherein:
the use approval determiner is configured to generate a use approval signal when the use approval determiner receives the first approval signal and the second approval signal, and
the use approval signal is configured to trigger use of or access to the display device.

6. The display device of claim 5, wherein:
the use approval determiner generates a use disapproval signal when the use approval determiner receives at least one of the first refusal signal or the second refusal signal, and
the use disapproval signal is configured to deny use of or access to the display device.

7. The display device of claim 2, further comprising:
a use approval determiner,
wherein the fingerprint detector includes a fake fingerprint detector and a fingerprint analyzer, and wherein the fake fingerprint detector is configured to:
transmit a first approval signal to the fingerprint analyzer when the transmission rate of the light is the reference transmission rate or more; and
transmit a first refusal signal to the fingerprint analyzer when the transmission rate of the light is less than the reference transmission rate.

8. The display device of claim 7, wherein the fingerprint analyzer is configured to calculate an accordance rate between the transmission rate of the light and the registration transmission rate when the first approval signal is transmitted.

9. The display device of claim 8, wherein the fingerprint analyzer is configured to:
transmit a second approval signal to the use approval determiner when the accordance rate is a predetermined threshold value or more; and
transmit a second refusal signal to the use approval determiner when the accordance rate is less than the predetermined threshold value.

10. The display device of claim 9, wherein:
the use approval determiner is configured to generate a use approval signal when the use approval determiner receives the second approval signal, and
the use approval signal is configured to trigger use of or access to the display device.

11. The display device of claim 10, wherein:
the use approval determiner is configured to generate a use disapproval signal when the use approval determiner receives the second refusal signal, and
the use disapproval signal is configured to deny use of or access to the display device.

12. The display device of claim 2, wherein:
the first wavelength range is about 600 nm or more,
the optical filter includes a plurality of openings including at least one opening corresponding to the second area, and
the sensor is configured to sense light corresponding to the first wavelength range through the at least one opening.

13. The display device of claim 12, wherein the plurality of openings are disposed to be spaced apart from each other at a first separation distance on a plane, such that at least one of the plurality of openings corresponds to the detected fingerprint.

14. A method of driving a display device including a display panel, a sensor, an optical filter, and a fingerprint detector, the method comprising: p1 sensing, by the sensor, light transmitted through the display panel, wherein the sensor is disposed on the display panel and includes a first area and a second area;
blocking, by the optical filter, light corresponding to a first wavelength range, wherein the optical filter is disposed between the display panel and the sensor, overlaps with the first area and does not overlap with the second area; and
determining, by the fingerprint detector, whether a fingerprint is a fake fingerprint or a pre-registered fingerprint based on a first sensing signal corresponding to an area in contact with a finger in the second area and a second sensing signal corresponding to an area not in contact with the finger among sensing signals from the sensor.

15. The method of claim 14, wherein:
the display device includes a memory,
the method further includes:
calculating, by the fingerprint detector, a transmission rate of light corresponding to the first wavelength range based on a first light intensity of light corresponding to the first wavelength range which corresponds to the first sensing signal, and a second light intensity corresponding to the first wavelength range which corresponds to the second sensing signal, and
determining whether the fingerprint is the fake fingerprint includes comparing the transmission rate of the light with a reference transmission rate pre-stored in the memory, and
determining whether the fingerprint corresponds to the pre-registered fingerprint includes comparing the transmission rate of the light with a registration transmission rate pre-stored in the memory.

16. The method of claim 15, wherein:
the display device includes a use approval determiner and the fingerprint detector includes a fake fingerprint detector and a fingerprint analyzer, and
comparing the transmission rate of the light with the pre-stored reference transmission rate includes:
transmitting, by the fake fingerprint detector, a first approval signal to the use approval determiner when the transmission rate of the light is the reference transmission rate or more; and
transmitting, by the fake fingerprint detector, a first refusal signal to the use approval determiner when the transmission rate of the light is less than the reference transmission rate.

17. The method of claim 16, wherein:
comparing the transmission rate of the light with the pre-stored registration transmission rate includes:
transmitting, by the fingerprint analyzer, a second approval signal to the use approval determiner when an accordance rate between the transmission rate of the light and the registration transmission rate is a predetermined threshold value or more; and transmitting, by the fingerprint analyzer, a second refusal signal to the use approval determiner when the accordance rate between the transmission rate of the light and the registration transmission rate is less than the predetermined threshold value.

18. The method of claim 17, further comprising:

generating, by the use approval determiner, a use approval signal when the use approval determiner receives the first approval signal and the second approval signal;

allowing use of or access to the display device based on the use approval signal when the use approval signal is generated;

generating a use disapproval signal when the use approval determiner receives at least one of the first refusal signal or the second refusal signal; and stopping use of or access to the display device based on the use disapproval signal when the use disapproval signal is generated.

19. The method of claim 15, wherein:

the display device includes a use approval determiner and the fingerprint detector includes a fake fingerprint detector and a fingerprint analyzer, and comparing the transmission rate of the light with the pre-stored reference transmission rate includes:

transmitting, by the fake fingerprint detector, a first approval signal to the fingerprint analyzer when the transmission rate is the reference transmission rate or more; and transmitting, by the fake fingerprint detector, a first refusal signal to the fingerprint analyzer when the transmission rate of the light is less than the reference transmission rate.

20. A display device, comprising:

a display panel;

a sensor disposed on the display panel and including a first area and a second area, the sensor configured to sense light transmitted through the display panel; and an optical filter disposed between the display panel and the sensor, the optical filter overlapping with the first area and not overlapping with the second area, the optical filter configured to block the light of a first wavelength range, wherein the first area at least partially surrounds the second area and the optical filter includes at least one opening of a plurality of openings corresponding to the second area, wherein the at least one opening enables light to pass through to reach the second area, wherein the optical filter transmits light of a second wavelength range to the first area and the sensor receives the light of the second wavelength range through the first area, and wherein the plurality of openings are disposed to be spaced apart from each other at a first separation distance on a plane, such that at least one of the plurality of openings corresponds to a detected fingerprint, wherein the sensor further includes a first sensor pixel and a second sensor pixel, the first sensor pixel is disposed in the first area, and the second sensor pixel is disposed in the second area, and wherein the first sensor pixel is configured to receive the light of the second wavelength range through the first area overlapping with the optical filter.

* * * * *